United States Patent [19]
Komoike et al.

[11] Patent Number: 5,889,422
[45] Date of Patent: *Mar. 30, 1999

[54] SEMICONDUCTOR INTEGRATED CIRCUIT

[75] Inventors: Tatsunori Komoike; Kazuhiro Sakashita, both of Tokyo, Japan

[73] Assignee: Mitsubishi Denki Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 729,296

[22] Filed: Oct. 10, 1996

[30] Foreign Application Priority Data

Apr. 25, 1996 [JP] Japan ................................ 8-105590

[51] Int. Cl.⁶ .................................................. H03K 3/037
[52] U.S. Cl. .......................... 327/200; 327/202; 327/203; 327/208
[58] Field of Search ................................ 327/200, 202–3, 327/208

[56] References Cited

U.S. PATENT DOCUMENTS

| | | | |
|---|---|---|---|
| 5,508,648 | 4/1996 | Banik | 327/203 |
| 5,546,036 | 8/1996 | Sommer et al. | 327/203 |
| 5,552,737 | 9/1996 | Chen et al. | 327/203 |
| 5,646,567 | 7/1997 | Felix | 327/203 |

*Primary Examiner*—Margaret Rose Wambach
*Attorney, Agent, or Firm*—Oblon, Spivak, McClelland, Maier & Neustadt, P.C.

[57] ABSTRACT

Power consumption is reduced in a semiconductor integrated circuit. In a conventional flip-flop circuit, there is a transistor between one side current electrode of a PMOS transistor (PTr7) and an node (V0) of a power source. This transistor is deleted and one side current electrode of (PTr7) is connected to an node (D2). In a similar manner, one side current electrode of (PTr13) is connected to an node (D13), one side current electrode of an NMOS transistor (NTr6) is connected to an node (D6), and one side current electrode of (NTr14) is connected to an node (D12). Thus, by deleting transistors, the capacity of transistors which are to be driven by a clock signal is reduced, and therefore, power consumption is reduced.

7 Claims, 30 Drawing Sheets

FIG. 2

| FIG. 2A | FIG. 2B |
|---|---|

FIG. 5

| FIG. 5A | FIG. 5B |
|---|---|

F I G. 5 A
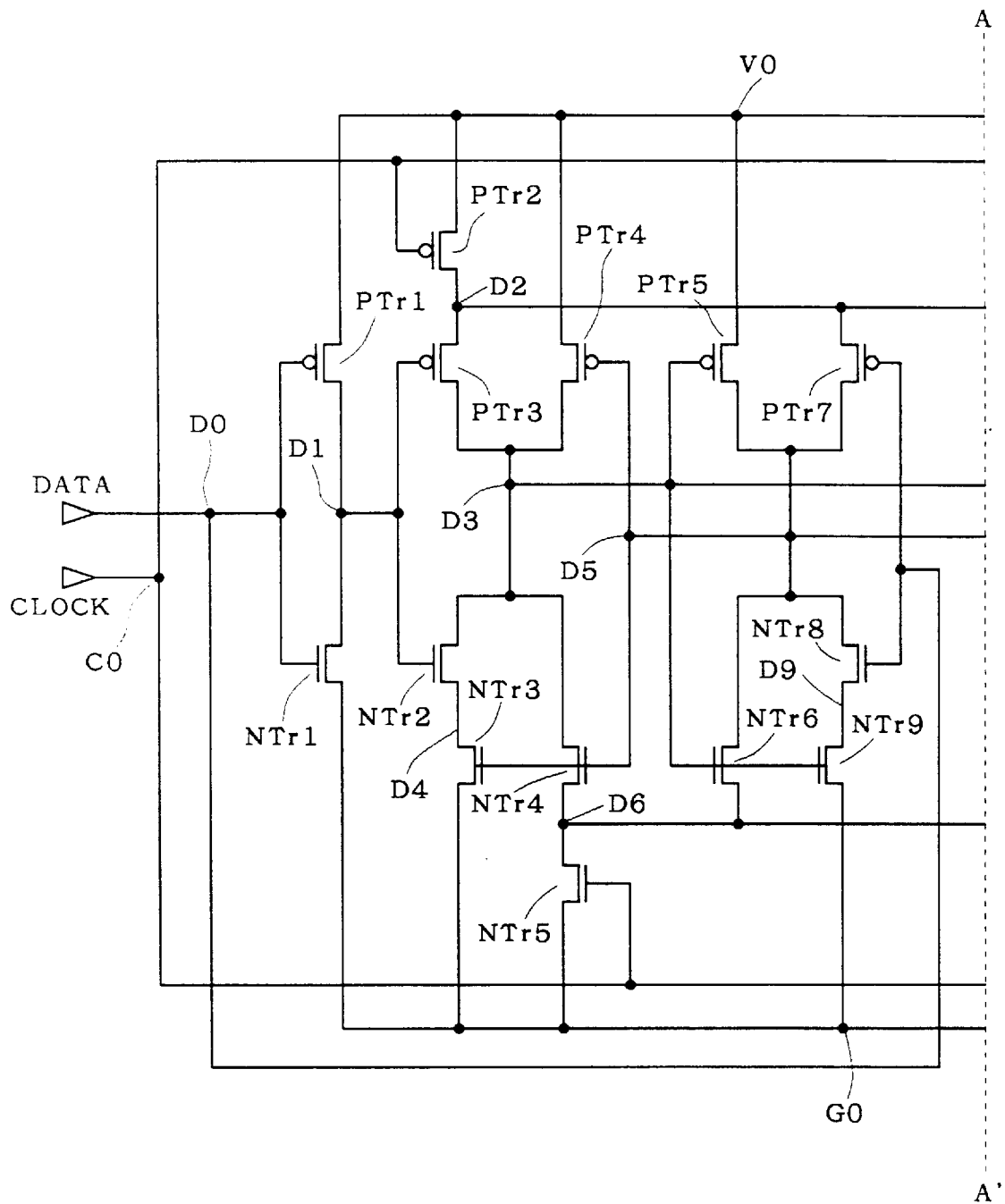

FIG. 6

| FIG. 6A | FIG. 6B |

| FIG. 11A | FIG. 11B |

SEMICONDUCTOR INTEGRATED CIRCUIT

BACKGROUND OF THE INVENTION

1. Field of the Invention

The present invention relates to semiconductor integrated circuits and those which are used as memory circuits, and more particularly, to semiconductor integrated circuits which reduce power consumption.

2. Description of the Prior Art

A memory circuit (usually, a flip-flop (hereinafter "FF")) is essential as a circuit which is used in a currently available semiconductor integrated circuit (LSI). FIGS. 11A and 11B are views showing an example of a structure of an FF which is used in a conventional semiconductor integrated circuit, as it is cut along a line A–A'. FIG. 11 is a general view showing the respective positions of FIGS. 11A and 11B. FIG. 11A shows a master side of the flip-flop circuit, while FIG. 11B shows a slave side of the flip-flop circuit. In FIGS. 11A and 11B, PTrX (X is an integer from 1 to 17) denotes a PMOS transistor, NTrX (X is an integer from 1 to 17) denotes an NMOS transistor, DX (X is an integer from 1 to 19) denotes a node, Q denotes an output, and *Q denotes an inverted output of the output Q. FIGS. 11A and 11B are contiguous to each other at the line A–A'. In FIGS. 11A and 11B, nodes V0, C0, D3, D5 and G0 are electrically connected to each other. The nodes V0 and V1 are electrically connected to power sources. The node C0 receives a clock signal (CLOCL). The nodes G0 and G1 are each grounded. The node D0 receives data (DATA).

A PMOS transistor is characterized in that it is turned on when the signal level at the gate is "L" level so that a current is conducted between a source electrode and a drain electrode from a high signal level side to a low signal level side. Further, a PMOS transistor is turned off when the signal level at the gate is "H" level, and a current is shut off between the source electrode and the drain electrode. Conversely, an NMOS transistor is characterized in that it is turned on when the signal level at the gate is "H" level so that a current is conducted between a source electrode and a drain electrode from a high signal level side to a low signal level side. Further, an NMOS transistor is turned off when the signal level at the gate is "L" level, and a current is shut off between the source electrode and the drain electrode. If a current is conducted and shut off between the source electrode and the drain electrode as described above depending on the signal level at the gate, a transistor is operating normally.

Next, an operation of the FF shown in FIGS. 11A and 11B will be described. It is assumed that data and the clock signal are both at "L" level. Since the clock signal is at "L" level, PTr2, PTr6, PTr10 and PTr12 are turned on, while NTr5, NTr7, NTr11 and NTr15 are turned off. Since the data are at "L" level, PTr1 and PTr7 are turned on, while NTr1 and NTr8 are turned off. As a result, the nodes D2, D7, D13 and D16 are at "H" level, while the nodes D6, D8, D12 and D17 are at "L" level. The node D1 is at "H" level.

Since PTr7 is already on, the circuit is conducted between the power source and the node D5. Hence, the node D5 is at "H" level. Since the node D1 is at "H" level, PTr3 is turned off and NTr2 is turned on.

Since the node D5 is at "H" level, PTr4 is turned off, while NTr3 and NTr4 are turned on. Further, PTr15 is turned off while NTr14 is turned on. Since NTr3 is turned on in addition to NTr2 which is already on, the circuit is conducted between the ground and the node D3. Hence, the node D3 is at "L" level.

As the node D3 is at "L" level, PTr5 is turned on, while NTr6 and NTr9 are turned off. Further, PTr9 is turned on and NTr10 is turned off.

Next, it is assumed that only the clock signal changes from "L" level to "H" level. As this happens, since the clock signal is at "H" level, PTr2, PTr6, PTr10 and PTr12 are turned off, and NTr5, NTr7, NTr11 and NTr15 are turned on.

Since NTr5 is turned on in addition to NTr4 which is already on, the node D3 which is already at "L" level remains at "L" level. As the node D3 stays at "L" level, the circuit is shut off between the node D5 and the ground, so that the node D5 is kept at "H" level.

Since NTr15 is turned on in addition to NTr14 which is already on, the node D14 is at "L" level. As a result, PTr8, PTr11 and PTr17 are turned on, and NTr12 and NTr17 are turned off. Hence, the output *Q is at "H" level.

Since NTr11 is turned on in addition to the node D13 which is already at "H" level, the node D11 is at "H" level. As the node D11 is at "H" level, PTr13, PTr14 and PTr16 are turned off, while NTr13 and NTr16 are turned on. Hence, the output Q is at "L" level.

Now, it is assumed that only the clock signal changes from "H" level to "L" level while the data remain at "L" level. As this happens, although the nodes D7 and D16 change to "H" level, the nodes D3, D5, D1 and D14 do not change but keep the current operation results ("H" level or "L" level at each node) described above. If the data remain unchanged as in this example, even though the clock signal changes, internal data do not change. The data can be held in this manner.

In a case where only the clock signal changes while the data remain at "H" level as well, although the signal levels at the nodes D3, D5, D11 and D14 are opposite to those described above, similar operation results are maintained.

In an actual operation of the circuit, however, the data do not necessarily maintain a constant signal level such as "H" level or "L" level. Although the signal level of the data appropriately changes while the circuit is in operation, the signal level of the data as it is currently in response to a change in the clock signal is maintained, as described above.

As described above, a function of temporarily maintaining a condition is realized by means of a change in the data and the clock signal, turning on and off of the transistors which are connected to the data and the clock signal, operations of the transistors which are turned on and off depending on "H" level and "L" level at the nodes which are connected to the transistors, etc. When such a function is realized, at gates which operate in synchronization to the clock signal within PTr2, PTr6, PTr10, PTr12, NTr5, NTr7, NTr11 and NTr15, capacities associated with the gates are charged or discharged. That is, a current is expended. Usually, a clock signal operates cyclically and most frequently in a synchronization type circuit, and therefore, power consumption which is equivalent to the eight transistors is very frequent.

Meanwhile, an integrated circuit device has an increasingly sophisticated performance and function in recent years. In a circuit which uses a number of memory circuit elements such as a microprocessor in accordance with this, power consumption is increasingly large. On the other hand, products such as recent type information equipment are desired to use less electric power while maintaining an advanced function.

In addition, a shorter research and development period is demanded. While an automatic design method such as a logic synthesizing system is widely adopted, with respect to supply of a clock signal to an FF which does not require an operation, a method adopted is to stop the clock signal by means of a control signal dandy a logic circuit. However, this method requires using a control signal and a circuit separately in order to realize this, and therefore, there are disadvantages such as an increased number of interconnectons, more difficulty in designing timing, and a longer period for designing. Thus, an element and a structure of an integrated circuit device which inherently expenses less power are urgently needed.

SUMMARY OF THE INVENTION

A first aspect of the present invention is directed to a semiconductor integrated circuit which has a circuit structure consisting of a plurality of transistors of the same polarity whose control electrodes receive the same clock signal, whose first current electrodes are connected to the same node and whose second current electrodes are connected to different nodes from each other, wherein the circuit structure is replaced with one transistor of the same polarity as the plurality of transistors whose control electrode receives the clock signal, whose first current electrode is connected to the same node and whose second current electrode is connected commonly to the different nodes.

According to a second aspect of the present invention, in the semiconductor integrated circuit of the first aspect, the circuit structure is included in a flip-flop circuit or a latch circuit, and the circuit structure is replaced with the one transistor.

According to a third aspect of the present invention, the semiconductor integrated circuit of the first aspect further includes subsequent-stage transistors whose control electrodes respectively receive signals which are developed at the second current electrodes of the plurality of transistors, and the circuit structure is replaced with the one transistor to such an extent which ensures normal operations of subsequent-stage transistors.

According to a fourth aspect of the present invention, in the semiconductor integrated circuit of the second aspect, the plurality of transistors are included only in a master side or only in a slave side of the flip-flop circuit.

According to a fifth aspect of the present invention, the semiconductor integrated circuit of the third aspect further includes a test circuit which selects a signal which is used to test the semiconductor integrated circuit or a signal which is used in a regular use of the semiconductor integrated circuit, and the test circuit outputs a selected signal to the flip-flop circuit or latch circuit.

Thus, according to the first aspect of the present invention, since a plurality of transistors of the same polarity are replaced with one transistor, the capacity of transistors which are to be driven by a clock signal is reduced, and therefore, power consumption is reduced.

Further, according to the second aspect of the present invention, the present invention is applicable to a flip-flop circuit or a latch circuit which includes transistors which operate when receiving the same clock signal at control electrodes.

According to the third aspect of the present invention, since the subsequent-stage transistors operate normally, the semiconductor integrated circuit operates normally.

According to the fourth aspect of the present invention, in the flip-flop circuit, the transistors which are included only in the master side or only in the slave side are replaced with one transistor. Therefore, the flip-flop circuit operates normally.

According to the fifth aspect of the present invention, reduction in power consumption is possible even while the semiconductor integrated circuit is tested, and therefore, a cost associated with the test is accordingly reduced.

Accordingly, an object of the present invention is to obtain a semiconductor integrated circuit which reduces power consumption.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a general view showing the respective positions of FIGS. 2A and 2B.

FIG. 5 is a general view showing the respective positions of FIGS. 5A and 5B.

FIG. 5A is a view showing a part of a fifth example of the FF which is used in the semiconductor integrated circuit according to the first preferred embodiment of the present invention.

FIG. 6 is a general view showing the respective positions of FIGS. 6A and 6B.

DESCRIPTION OF THE PREFERRED EMBODIMENTS

First Preferred Embodiment

Figure 1:
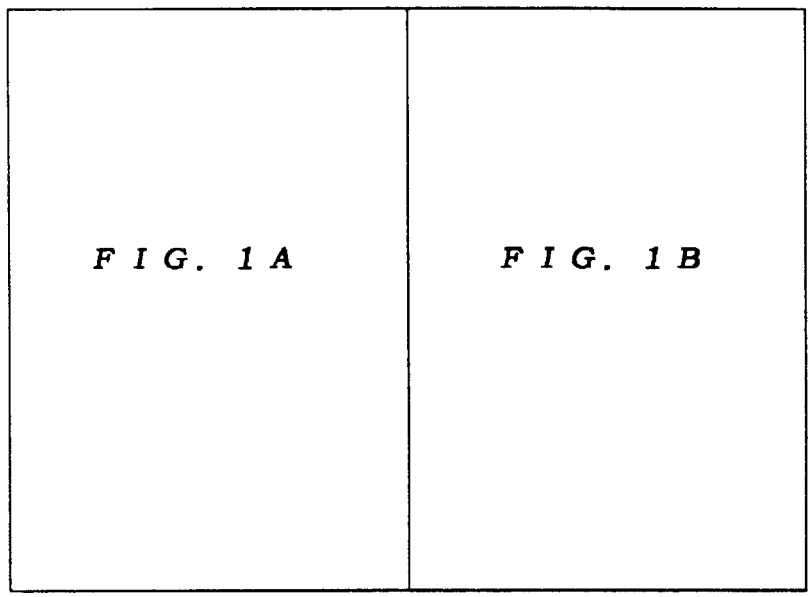
FIG. 1 is a general view showing the respective positions of FIGS. 1A and 1B.
Figure 1A:
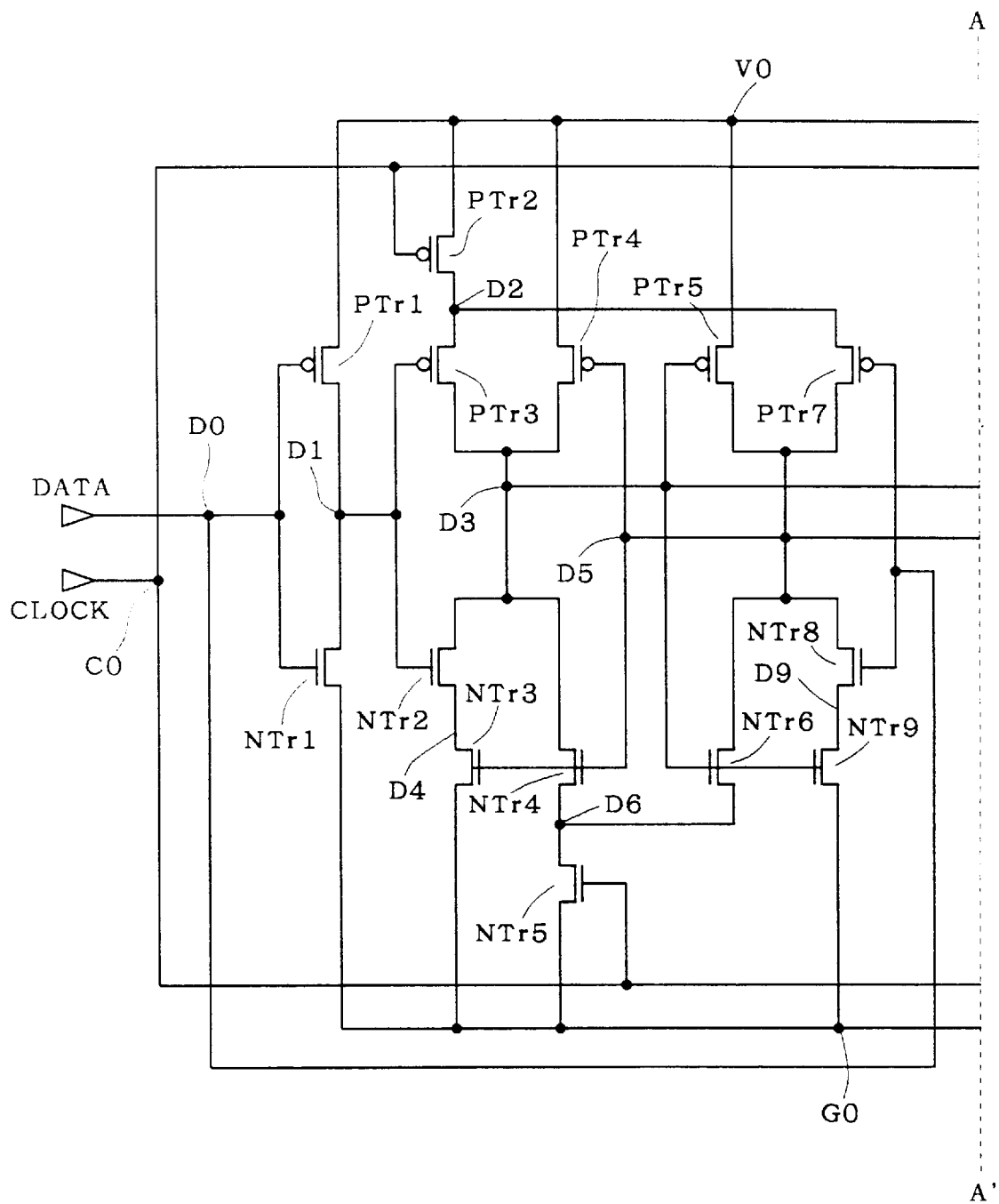
FIG. 1A is a view showing a part of a first example of an FF which is used in a semiconductor integrated circuit according to a first preferred embodiment 1 of the present invention.
Figure 1B:
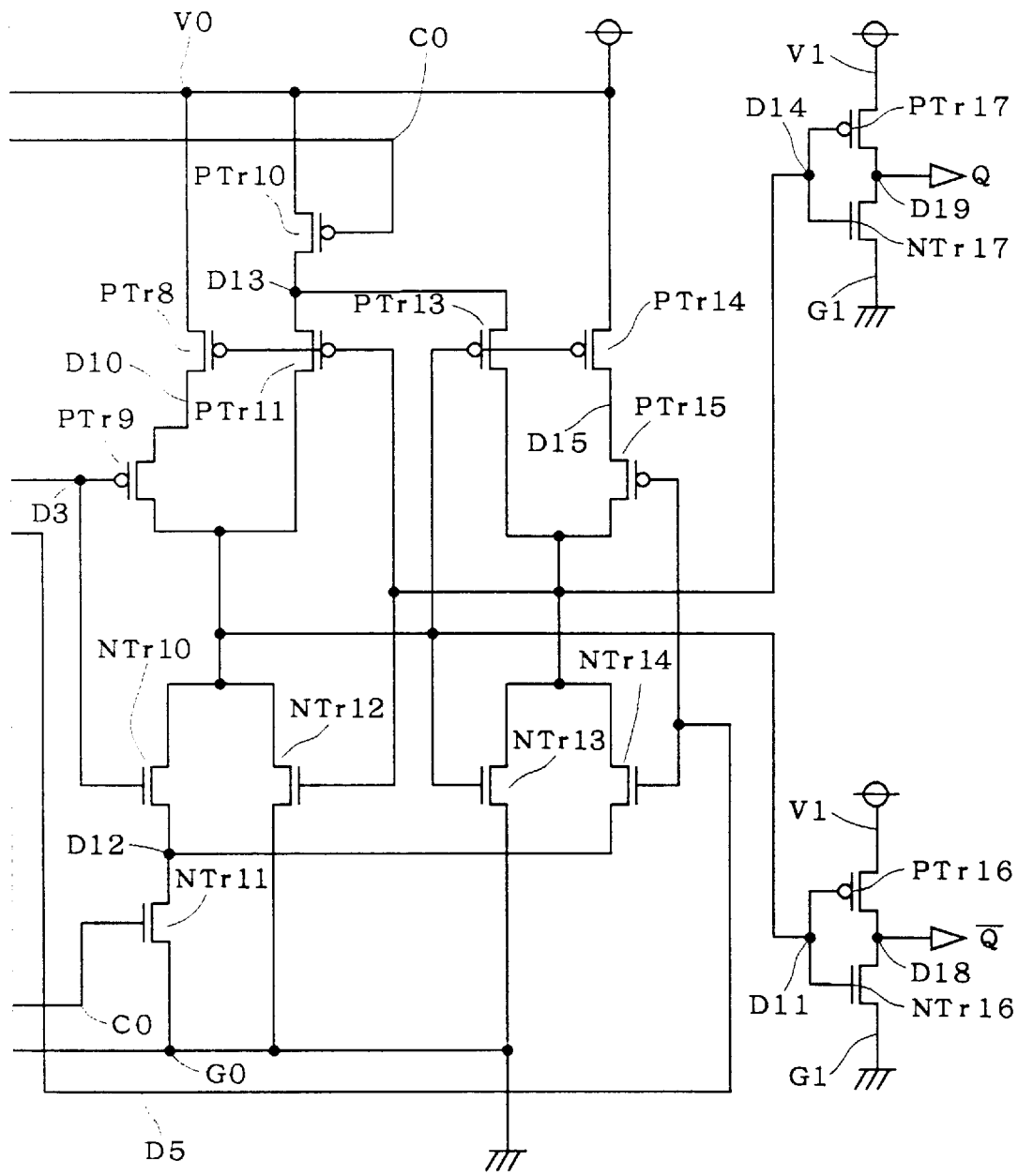
FIG. 1B is a view showing other part of the first example of the FF which is used in the semiconductor integrated circuit according to the first preferred embodiment of the present invention.

FIGS. 1A and 1B are views showing an example of a structure of an FF which is used in a semiconductor integrated circuit according to a first preferred embodiment of the present invention, as it is cut along a line A–A'. FIG. 1 is a general view showing the respective positions of FIGS. 1A and 1B. FIG. 1A shows a master side of the flip-flop circuit, while FIG. 1B shows a slave side of the flip-flop circuit. In FIGS. 1A and 1B, the symbols PTrX, NTrX, DX, and *Q denote corresponding elements in FIGS. 11A and 11B. FIGS. 1A and 1B are contiguous to each other at the line A–A'. In FIGS. 1A and 1B, nodes V0, C0, D3, D5 and G0 are electrically connected to each other. The nodes V0 and V1 are electrically connected to power sources. The node C0 receives a clock signal. The nodes G0 and G1 are each grounded. The node D0 receives data.

Now, the structure will be described. The structure of the FF shown in FIGS. 1A and 1B is principally similar to the structure of the FF shown in FIGS. 11A and 11B. As described below, the structure of the FF shown in FIGS. 1A and 1B is equal to the structure shown in FIGS. 11A and 11B as it is modified to replace the structure (circuit structure) consisting of a plurality of transistors with one transistor. In other words, in the FF shown in FIGS. 11A and 11B, gate electrodes of PTr2 and PTr6 which have the same polarity receive the clock signal, and one side current electrodes of PTr2 and PTr6 are connected to the node V0 of the power source. Another side current electrode of PTr2 is connected to the node D2, while another side current electrode of PTr6 is connected to the node D7. Such a structure which consists of PTr2 and PTr6 is replaced with PTr2 whose gate electrode receives the clock signal, whose one side current electrode is connected to the node V0 of the power source, and whose other side current electrode is connected to the nodes D2 and D7.

Figure 11:
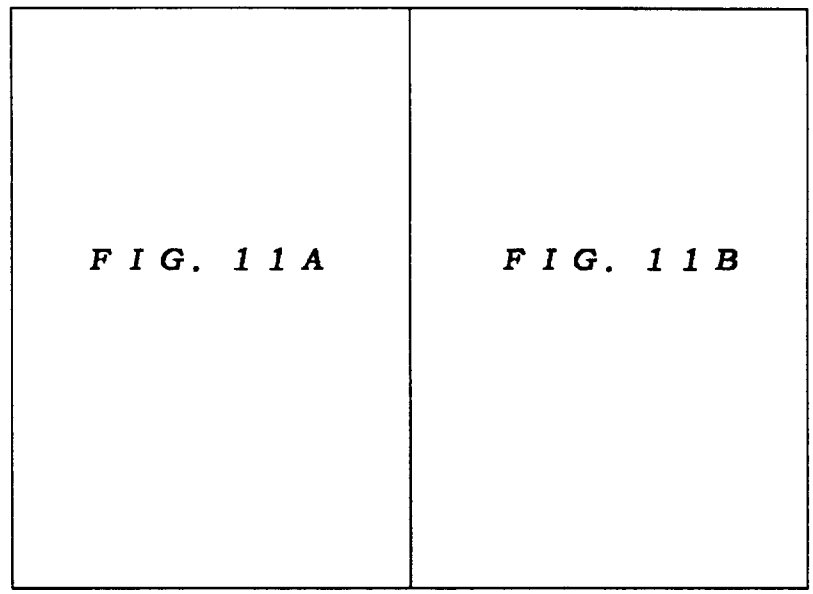
FIG. 11 is a general view showing the respective positions of FIGS. 11A and 11B.
Figure 11A:
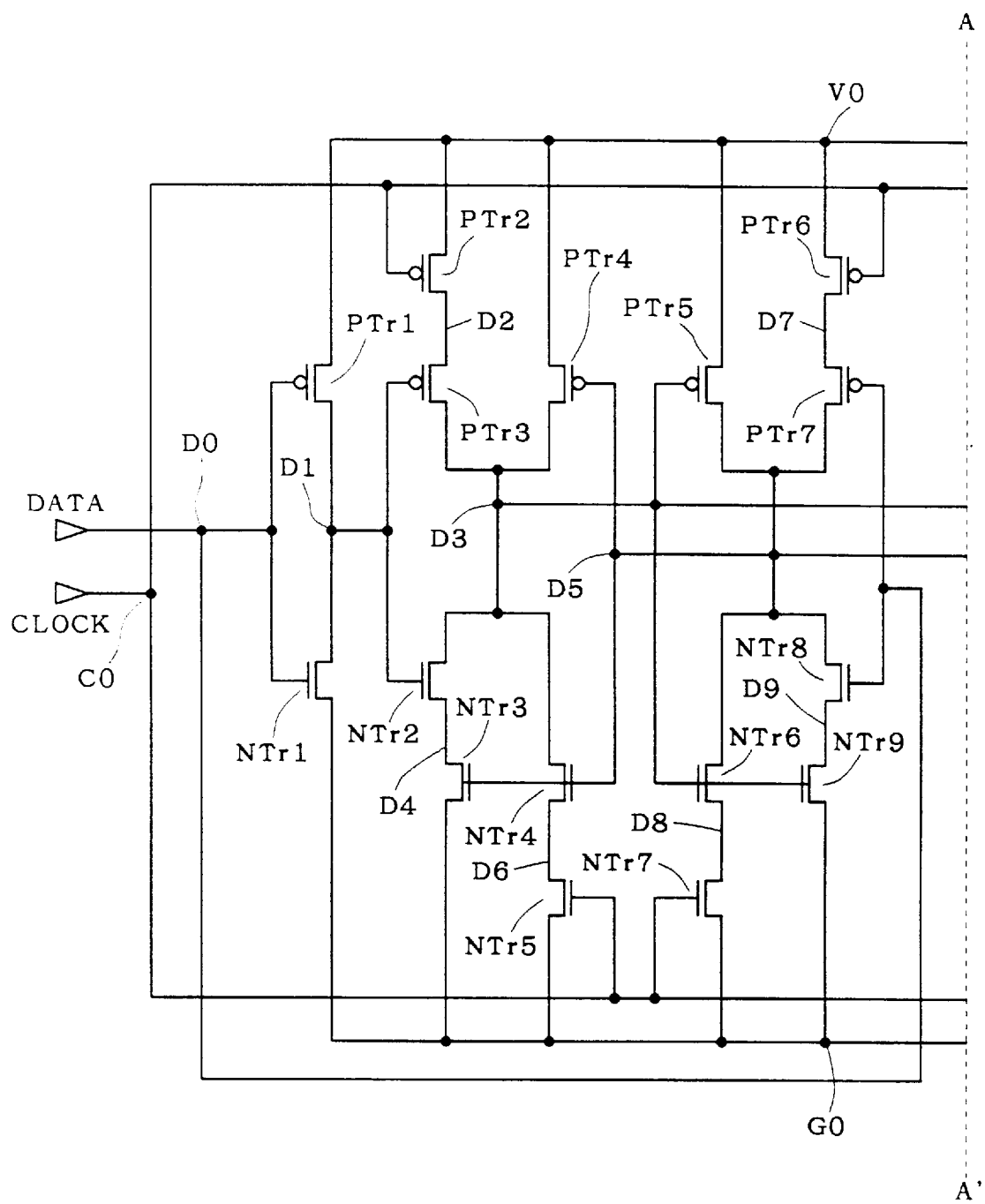
FIG. 11A is a view showing a part of an FF which is used in a conventional semiconductor integrated circuit.
Figure 11B:
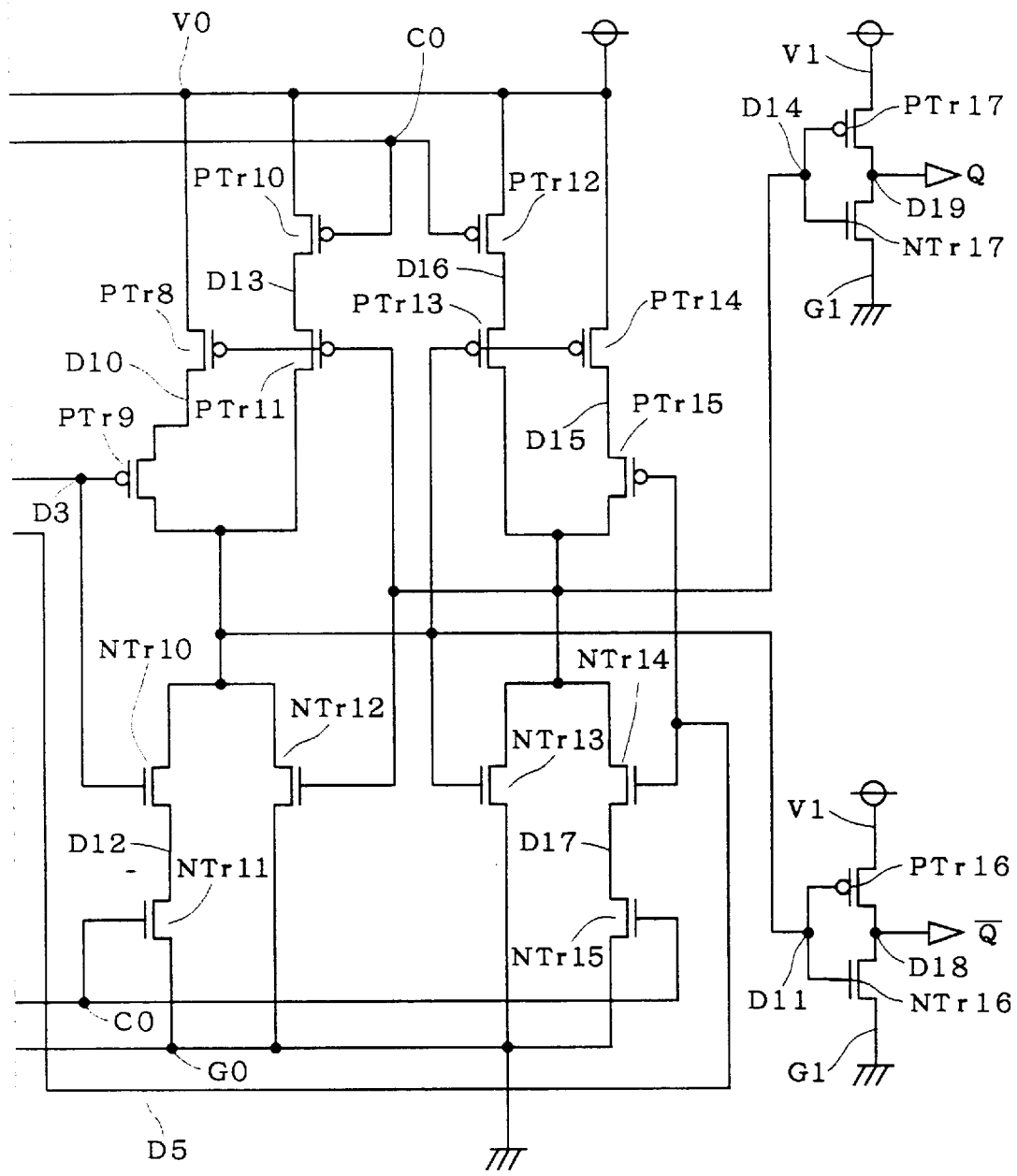
FIG. 11B is a view showing other part of the FF which is used in the conventional semiconductor integrated circuit.

In the FF shown in FIGS. 11A and 11B, gate electrodes of PTr10 and PTr12 which have the same polarity receive the clock signal, and one side current electrodes of PTr10 and PTr12 are connected to the node V0 of the power source. Another side current electrode of PTr10 is connected to the node D13, while another side current electrode of PTr12 is connected to the node D16. Such a structure which consists of PTr10 and PTr12 is replaced with PTr10 whose gate electrode receives the clock signal, whose one side current electrode is connected to the node V0 of the power source, and whose other side current electrode is connected to the nodes D13 and D16.

In the FF shown in FIGS. 11A and 11B, gate electrodes of NTr5 and NTr7 which have the same polarity receive the clock signal, and one side current electrodes of NTr5 and NTr7 are connected to the node G0 of the ground. Another side current electrode of NTr5 is connected to the node D6, while another side current electrode of NTr7 is connected to the node D8. Such a structure which consists of NTr5 and NTr7 is replaced with NTr5 whose gate electrode receives the clock signal, whose one side current electrode is connected to the node G0 of the ground, and whose other side current electrode is connected to the nodes D6 and D8.

In the FF shown in FIGS. 11A and 11B, gate electrodes of NTr11 and NTr15 which have the same polarity receive the clock signal, and one side current electrodes of NTr11 and NTr15 are connected to the node G0 of the ground. Another side current electrode of NTr11 is connected to the node D12, while another side current electrode of NTr15 is connected to the node D17. Such a structure which consists of NTr11 and NTr15 is replaced with NTr11 whose gate electrode receives the clock signal, whose one side current electrode is connected to the node G0 of the ground, and whose other side current electrode is connected to the nodes D12 and D17.

As described above, of PTr2, PTr6, PTr10, PTr12, NTr5, NTr7, NTr11 and NTr15, PTr6, PTr12, NTr7 and NTr15 are deleted, reducing the number of the transistors which operate in response to the clock signal to four gates from eight gates as shown in FIGS. 1A and 1B. In a resulting structure as well, an operation at each one of the nodes D2, D13, D6 and D12 which are shown in FIGS. 1A and 1B is similar to an operation at the nodes D2 and D7, the nodes D13 and D16, the nodes D6 and D8, and the nodes 12 and 17, respectively. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

Figure 2A:
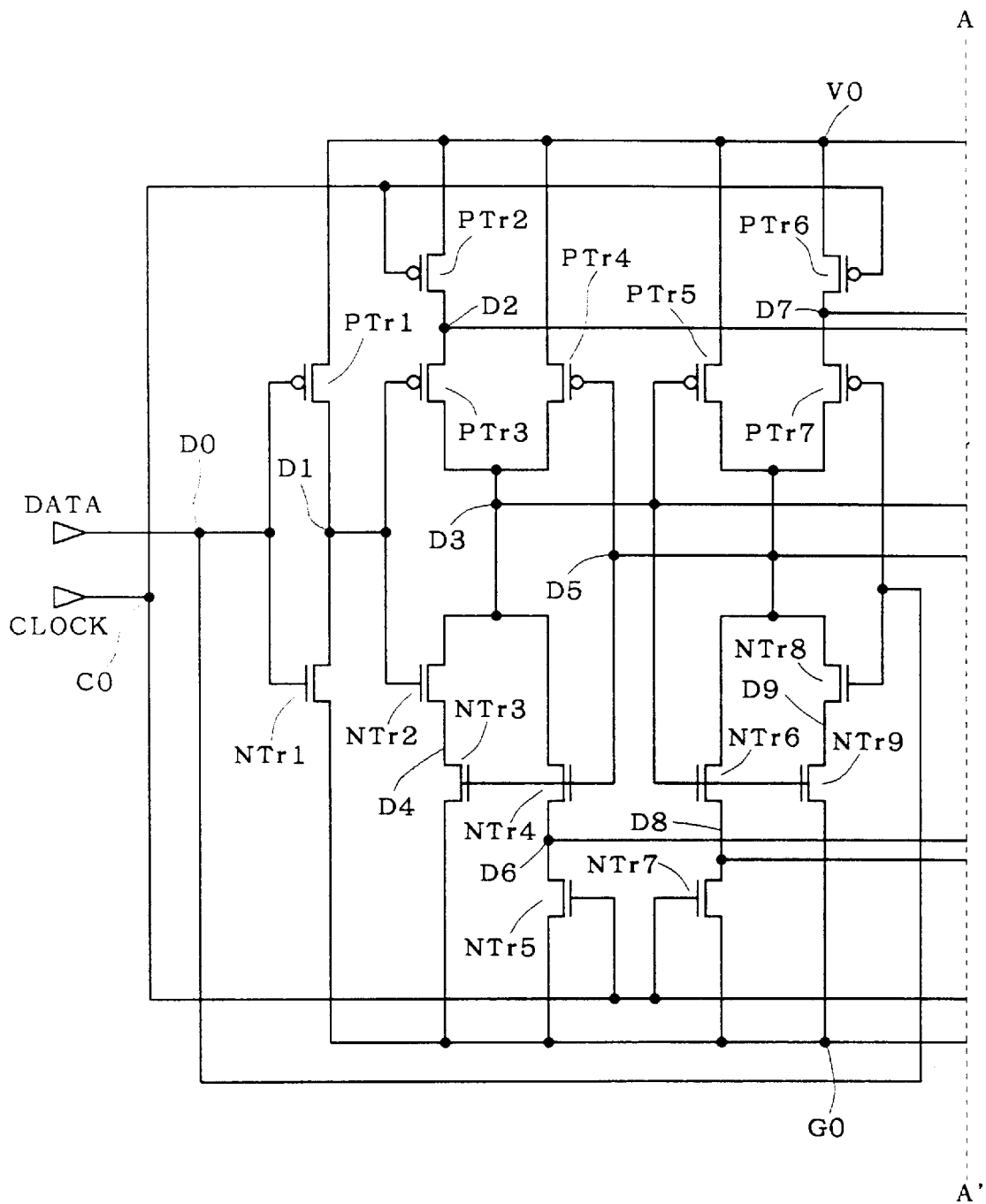
FIGS. 2A is a view showing a part of a second example of the FF which is used in the semiconductor integrated circuit according to the first preferred embodiment of the present invention.
Figure 2B:
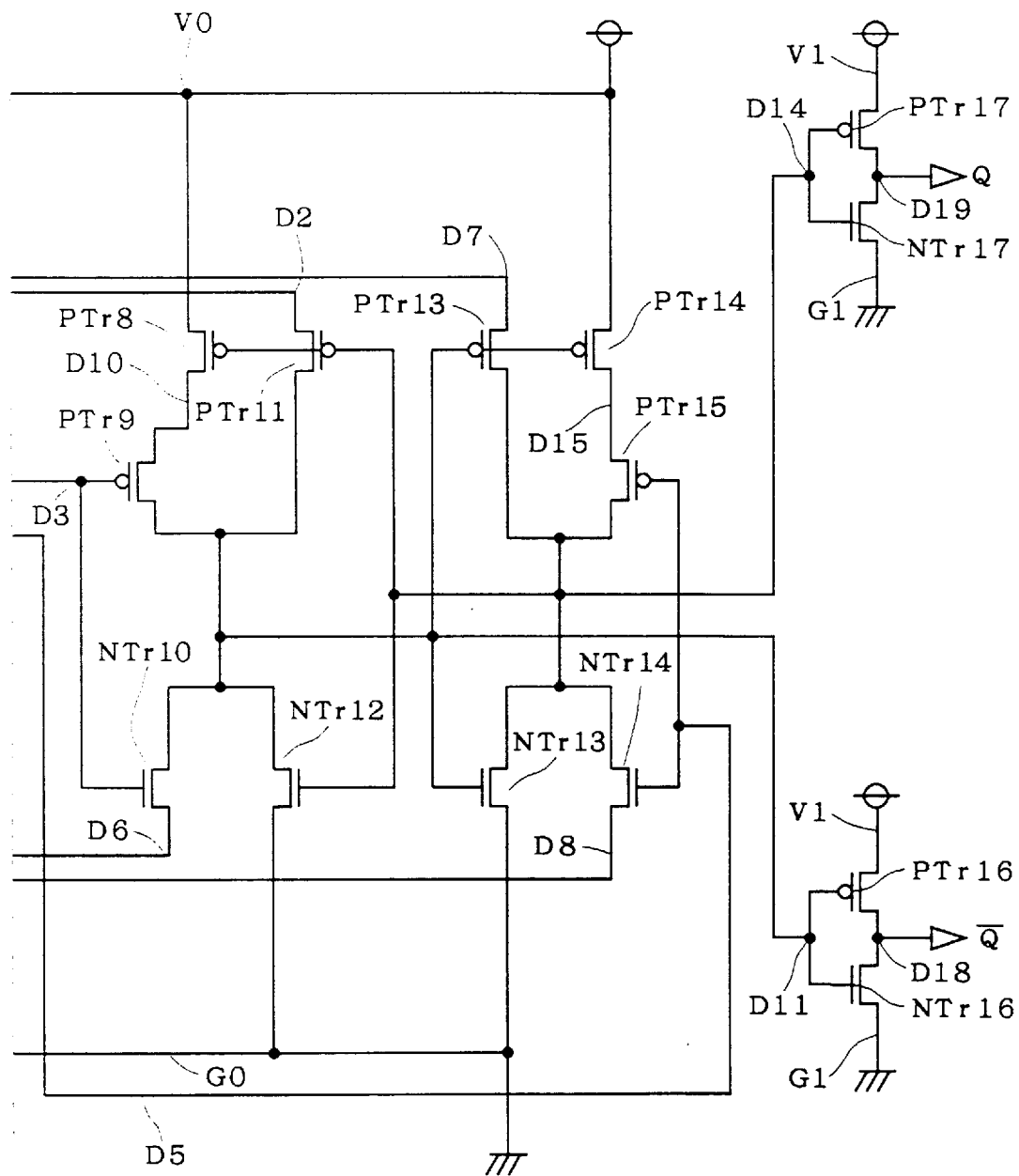
FIG. 2B is a view showing other part of the second example of the FF which is used in the semiconductor integrated circuit according to the first preferred embodiment of the present invention.

FIGS. 2A and 2B are views showing other example of the structure of the FF which is used in the semiconductor integrated circuit according to the first preferred embodiment of the present invention, as it is cut along a line A–A'. FIG. 2 is a general view showing the respective positions of FIGS. 2A and 2B. FIG. 2A shows a master side of the FF, while FIG. 2B shows a slave side of the FF. In FIGS. 2A and 2B, the symbols PTrX, NTrX, DX, and *Q denote corresponding elements in FIGS. 11A and 11B. FIGS. 2A and 2B are contiguous to each other at the line A–A'. In FIGS. 2A and 2B, nodes V0, D7, D2, D3, D5, D6, D8 and G0 are electrically connected to each other. The nodes V0 and V1 are electrically connected to power sources. The node C0 receives a clock signal. The nodes G0 and G1 are each grounded. The node D0 receives data.

Now, the structure will be described. The structure of the FF shown in FIGS. 2A and 2B is principally similar to the structure of the FF shown in FIGS. 11A and 11B. As described below, the structure of the FF shown in FIGS. 2A and 2B is equal to the structure shown in FIGS. 11A and 11B as it is modified to replace a plurality of transistors with one transistor. In other words, in the FF shown in FIGS. 11A and 11B, gate electrodes of PTr2 and PTr10 which have the same polarity receive the clock signal, and one side current electrodes of PTr2 and PTr10 are connected to the node V0 of the power source. Another side current electrode of PTr2 is connected to the node D2, while another side current electrode of PTr10 is connected to the node D13. Such a structure which consists of PTr2 and PTr10 is replaced with PTr2 whose gate electrode receives the clock signal, whose one side current electrode is connected to the node V0 of the power source, and whose other side current electrode is connected to the nodes D2 and D13.

In the FF shown in FIGS. 11A and 11B, gate electrodes of PTr6 and PTr12 which have the same polarity receive the clock signal, and one side current electrodes of PTr6 and PTr12 are connected to the node V0 of the power source. Another side current electrode of PTr6 is connected to the node D7, while another side current electrode of PTr12 is connected to the node D16. Such a structure which consists of PTr6 and PTr12 is replaced with PTr6 whose gate electrode receives the clock signal, whose one side current electrode is connected to the node V0 of the power source, and whose other side current electrode is connected to the nodes D7 and D16.

In the FF shown in FIGS. 11A and 11B, gate electrodes of NTr5 and NTr11 which have the same polarity receive the clock signal, and one side current electrodes of NTr5 and NTr11 are connected to the node G0 of the ground. Another side current electrode of NTr5 is connected to the node D6, while another side current electrode of NTr11 is connected to the node D12. Such a structure which consists of NTr5 and NTr11 is replaced with NTr5 whose gate electrode receives the clock signal, whose one side current electrode is connected to the node G0 of the ground, and whose other side current electrode is connected to the nodes D6 and D12.

In the FF shown in FIGS. 11A and 11B, gate electrodes of NTr7 and NTr15 which have the same polarity receive the clock signal, and one side current electrodes of NTr7 and NTr15 are connected to the node G0 of the ground. Another side current electrode of NTr7 is connected to the node D8, while another side current electrode of NTr15 is connected to the node D17. Such a structure which consists of NTr7 and NTr15 is replaced with NTr7 whose gate electrode receives the clock signal, whose one side current electrode is connected to the node G0 of the ground, and whose other side current electrode is connected to the nodes D8 and D17.

As described above, of PTr2, PTr6, PTr10, PTr12, NTr5, NTr7, NTr11 and NTr15, PTr10, PTr12, NTr11 and NTr15 are deleted, reducing the number of the transistors which operate in response to the clock signal to four gates from eight gates as shown in FIGS. 2A and 2B. In a resulting structure as well, an operation at the nodes D2, D7, D6 and D8 which are shown in FIGS. 2A and 2B is similar to an operation at the nodes D2 and D13, the nodes D7 and D16, the nodes D6 and D12, and the nodes D8 and D17, respectively. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

Figure 3:
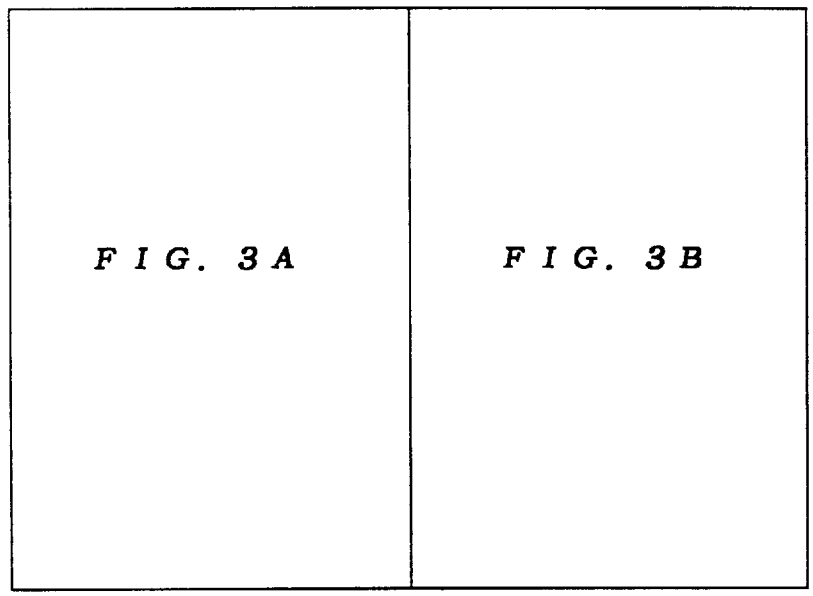
FIG. 3 is a general view showing the respective positions of FIGS. 3A and 3B
Figure 3A:
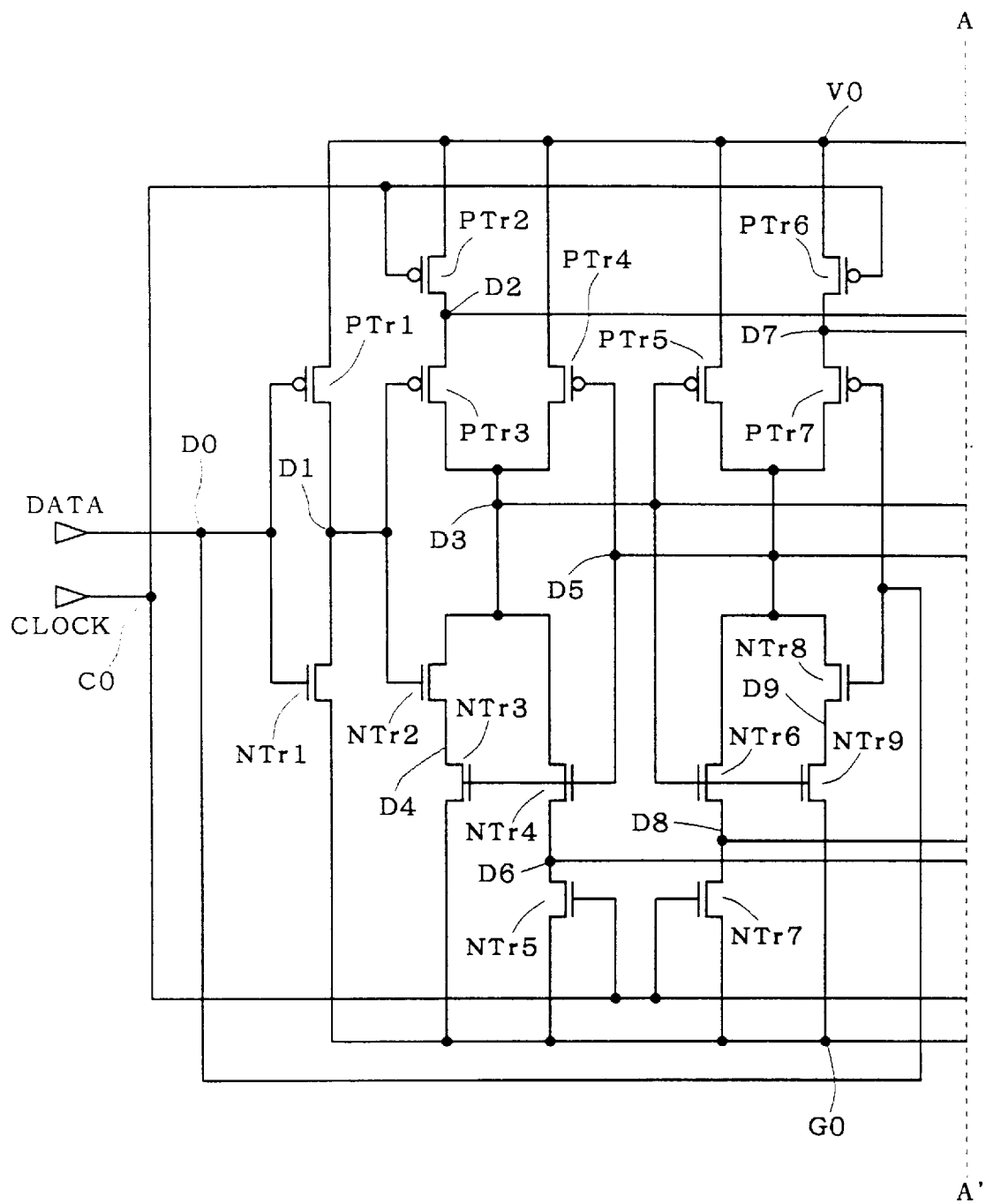
FIG. 3A is a view showing a part of a third example of the FF which is used in the semiconductor integrated circuit according to the first preferred embodiment of the present invention.
Figure 3B:
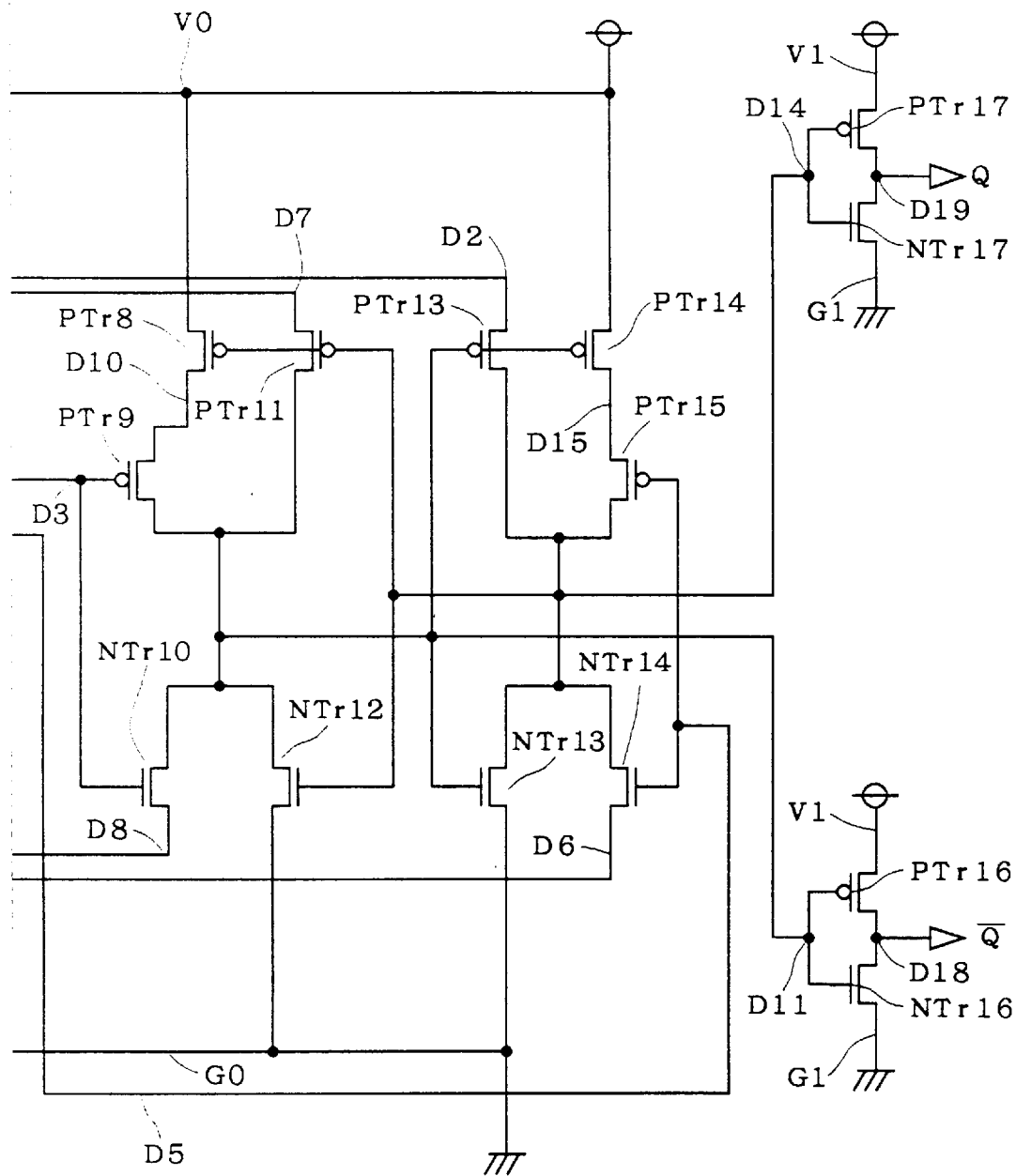
FIG. 3B is a view showing other part of the third example of the FF which is used in the semiconductor integrated circuit according to the first preferred embodiment of the present invention.

FIGS. 3A and 3B are views showing other example of the structure of the FF which is used in the semiconductor integrated circuit according to the first preferred embodiment of the present invention, as it is cut along a line A–A' FIG. 3 is a general view showing the respective positions of FIGS. 3A and 3B. FIG. 3A shows a master side of the FF, while FIG. 3B shows a slave side of the FF. In FIGS. 3A and 3B, the symbols PTrX, NTrX, DX, and *Q denote corresponding elements in FIGS. 11A and 11B. FIGS. 3A and 3B are contiguous to each other at the line A–A'. In FIGS. 3A and 3B, nodes V0, D7, D2, D3, D5, D6, D8 and G0 are electrically connected to each other. The nodes V0 and V1 are electrically connected to power sources. The node C0 receives a clock signal. The nodes G0 and G1 are each grounded. The node D0 receives data.

Now, the structure will be described. The structure of the FF shown in FIGS. 3A and 3B is principally similar to the structure of the FF shown in FIGS. 11A and 11B. As described below, the structure of the FF shown in FIGS. 3A and 3B is equal to the structure shown in FIGS. 11A and 11B as it is modified to replace a plurality of transistors with one transistor. In other words, in the FF shown in FIGS. 11A and 11B, gate electrodes of PTr2 and PTr12 which have the same polarity receive the clock signal, and one side current electrodes of PTr2 and PTr12 are connected to the node V0 of the power source. Another side current electrode of PTr2 is connected to the node D2, while another side current electrode of PTr12 is connected to the node D16. Such a structure which consists of PTr2 and PTr12 is replaced with PTr2 whose gate electrode receives the clock signal, whose one side current electrode is connected to the node V0 of the power source, and whose other side current electrode is connected to the nodes D2 and D16.

In the FF shown in FIGS. 11A and 11B, gate electrodes of PTr6 and PTr10 which have the same polarity receive the clock signal, and one side current electrodes of PTr6 and PTr10 are connected to the node V0 of the power source. Another side current electrode of PTr6 is connected to the node D7, while another side current electrode of PTr10 is connected to the node D13. Such a structure which consists of PTr6 and PTr10 is replaced with PTr6 whose gate electrode receives the clock signal, whose one side current electrode is connected to the node V0 of the power source, and whose other side current electrode is connected to the nodes D7 and D13.

In the FF shown in FIGS. 11A and 11B, gate electrodes of NTr5 and NTr15 which have the same polarity receive the clock signal, and one side current electrodes of NTr5 and NTr15 are connected to the node G0 of the ground. Another side current electrode of NTr5 is connected to the node D6, while another side current electrode of NTr15 is connected to the node D17. Such a structure which consists of NTr5 and NTr15 is replaced with NTr5 whose gate electrode receives the clock signal, whose one side current electrode is connected to the node G0 of the ground, and whose other side current electrode is connected to the nodes D6 and D17.

In the FF shown in FIGS. 11A and 11B, gate electrodes of NTr7 and NTr11 which have the same polarity receive the clock signal, and one side current electrodes of NTr7 and NTr11 are connected to the node G0 of the ground. Another side current electrode of NTr7 is connected to the node D8, while another side current electrode of NTr11 is connected to the node D12. Such a structure which consists of NTr7 and NTr11 is replaced with NTr7 whose gate electrode receives the clock signal, whose one side current electrode is connected to the node G0 of the ground, and whose other side current electrode is connected to the nodes D8 and D12.

As described above, of PTr2, PTr6, PTr10, PTr12, NTr5, NTr7, NTr11 and NTr15, PTr10, PTr12, NTr11 and NTr15 are deleted, reducing the number of the transistors which operate in response to the clock signal to four gates from eight gates as shown in FIGS. 3A and 3B. In a resulting structure as well, an operation at the nodes D2, D7, D6 and D8 which are shown in FIGS. 3A and 3B is similar to an operation at the nodes D2 and D16, the nodes D7 and D13, the nodes D6 and D17, and the nodes 8 and 12, respectively. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

Figure 4:
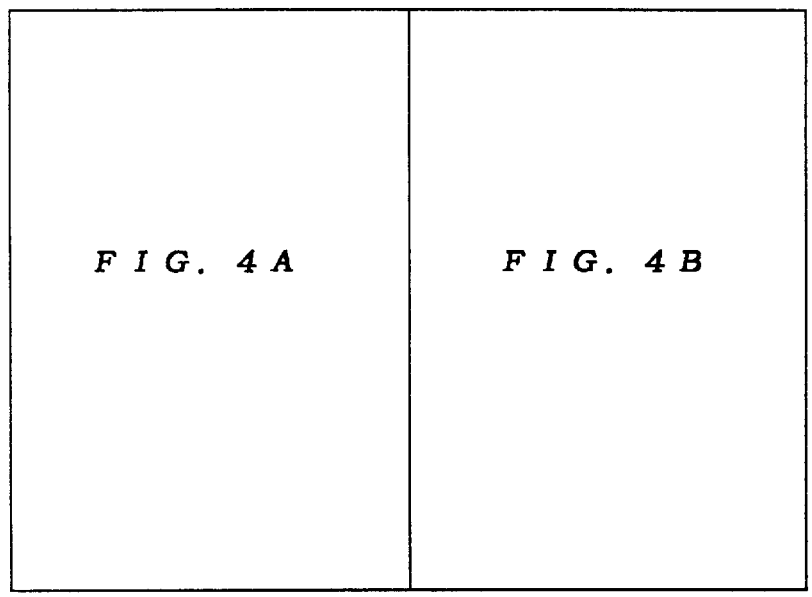
FIG. 4 is a general view showing the respective positions of FIGS. 4A and 4B.
Figure 4A:
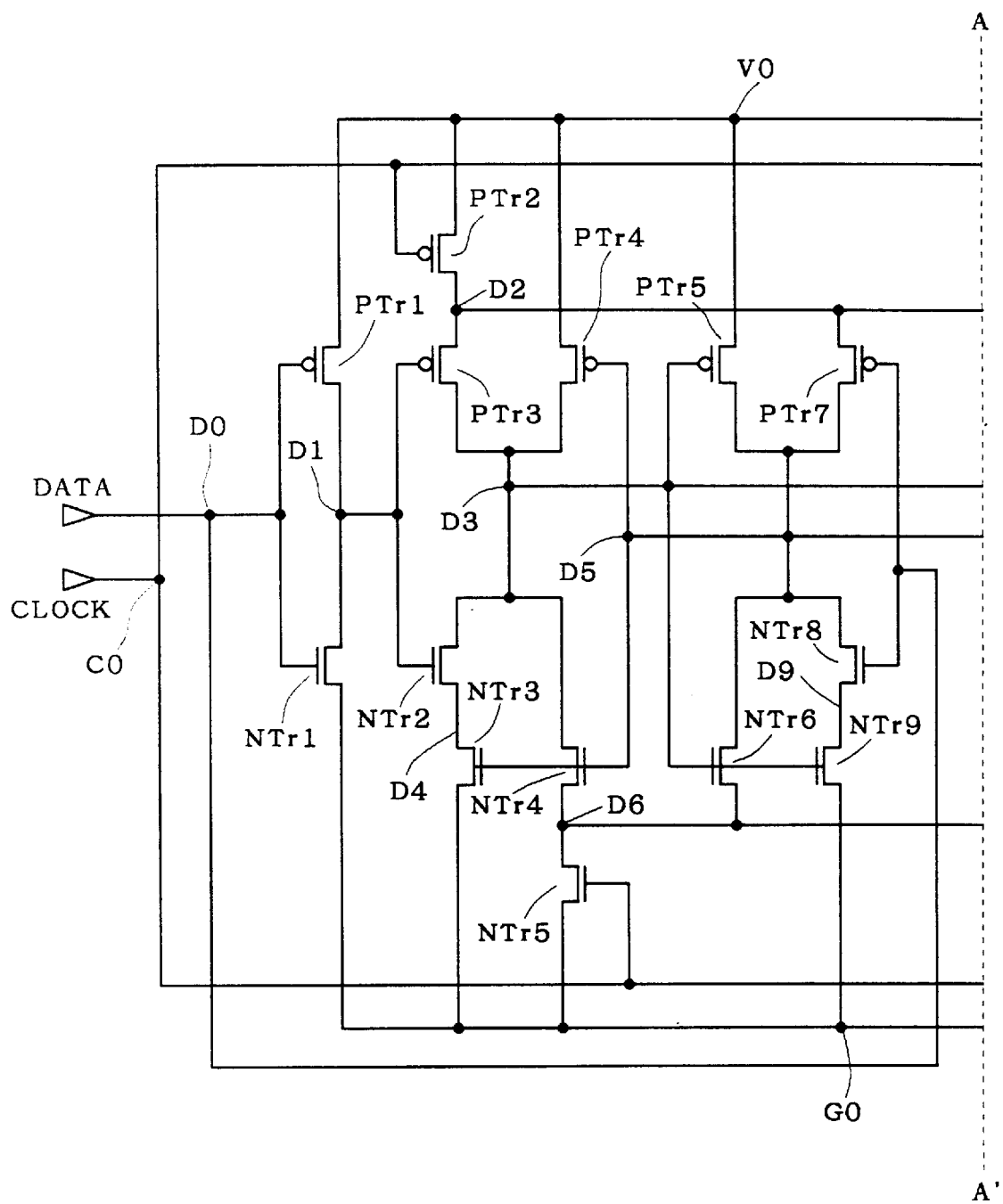
FIG. 4A is a view showing a part of a forth example of the FF which is used in the semiconductor integrated circuit according to the first preferred embodiment of the present invention.
Figure 4B:
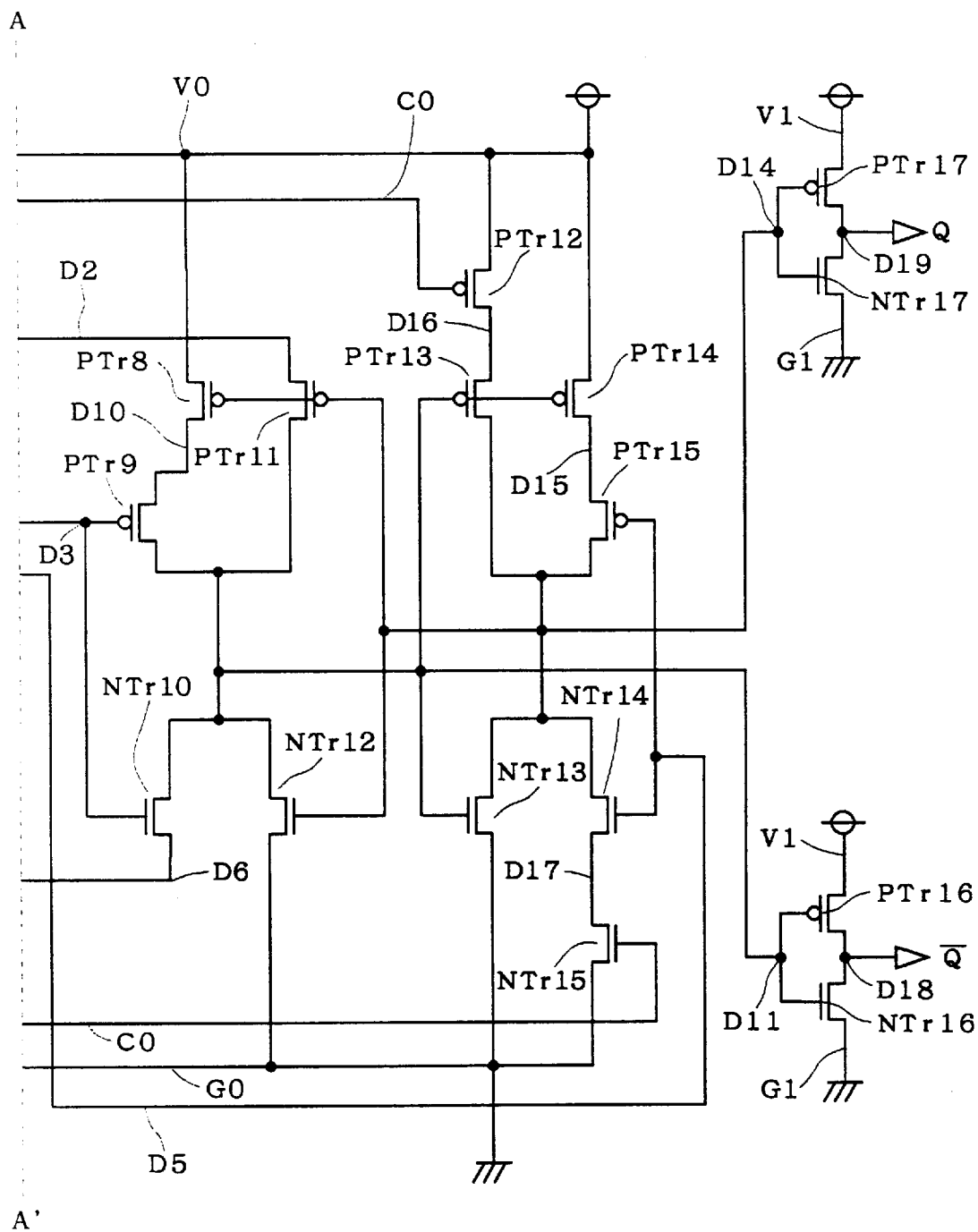
FIG. 4B is a view showing other part of the forth example of the FF which is used in the semiconductor integrated circuit according to the first preferred embodiment of the present invention.

FIGS. 4A and 4B are views showing other example of the structure of the FF which is used in the semiconductor integrated circuit according to the first preferred embodiment of the present invention, as it is cut along a line A–A'. FIG. 4 is a general view showing the respective positions of FIGS. 4A and 4B. FIG. 4A shows a master side of the FF, while FIG. 4B shows a slave side of the FF. In FIGS. 4A and 4B, the symbols PTrX, NTrX, DX, and *Q denote corresponding elements in FIGS. 11A and 11B. FIGS. 4A and 4B are contiguous to each other at the line A–A'. In FIGS. 4A and 4B, nodes V0, C0, D2, D3, D5, D6 and G0 are electrically connected to each other. The nodes V0 and V1 are electrically connected to power sources. The node C0 receives a clock signal. The nodes G0 and G1 are each grounded. The node D0 receives data.

Now, the structure will be described. The structure of the FF shown in FIGS. 4A and 4B is principally similar to the structure of the FF shown in FIGS. 11A and 11B. As described below, the structure of the FF shown in FIGS. 4A and 4B is equal to the structure shown in FIGS. 11A and 11B as it is modified to replace a plurality of transistors with one transistor. In other words, in the FF shown in FIGS. 11A and 11B, gate electrodes of PTr2, PTr6 and PTr10 which have the same polarity receive the clock signal, and one side current electrodes of PTr2, PTr6 and PTr10 are connected to the node V0 of the power source. Another side current electrode of PTr2 is connected to the node D2, another side current electrode of PTr6 is connected to the node D7, while another side current electrode of PTr10 is connected to the node D13. Such a structure which consists of PTr2, PTr6 and PTr10 is replaced with PTr2 whose gate electrode receives the clock signal, whose one side current electrode is connected to the node V0 of the power source, and whose other side current electrode is connected to the nodes D2, D7 and D13.

In the FF shown in FIGS. 11A and 11B, gate electrodes of NTr5, NTr7 and NTr11 which have the same polarity receive the clock signal, and one side current electrodes of NTr5, NTr7 and NTr11 are connected to the node G0 of the ground. Another side current electrode of NTr5 is connected to the node D6, another side current electrode of NTr7 is connected to the node D8, while another side current electrode of NTr11 is connected to the node D12. Such a structure which consists of NTr5, NTr7 and NTr11 is replaced with NTr5 whose gate electrode receives the clock signal, whose one side current electrode is connected to the node G0 of the ground, and whose other side current electrode is connected to the nodes D6, D8 and D12.

As described above, of PTr2, PTr6, PTr10, PTr12, NTr5, NTr7, NTr11 and NTr15, PTr6, PTr10, NTr7 and NTr11 are deleted, reducing the number of the transistors which operate in response to the clock signal to four gates from eight gates as shown in FIGS. 4A and 4B. In a resulting structure as well, an operation at the nodes D2 and D6 which are shown in FIGS. 4A and 4B is similar to an operation at the nodes D2, D7 and D13, the nodes D6, D8 and D12, respectively. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

Figures 5, 5A:
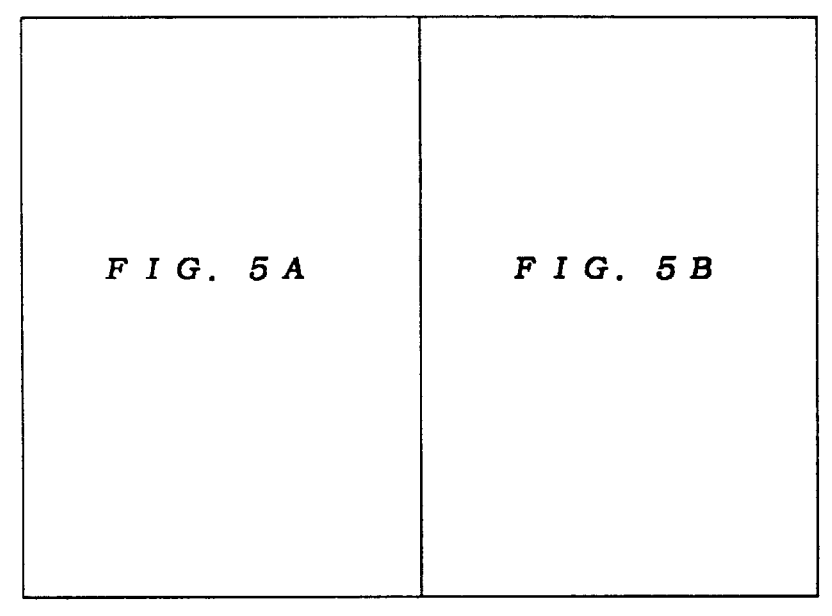
Figure 5B:
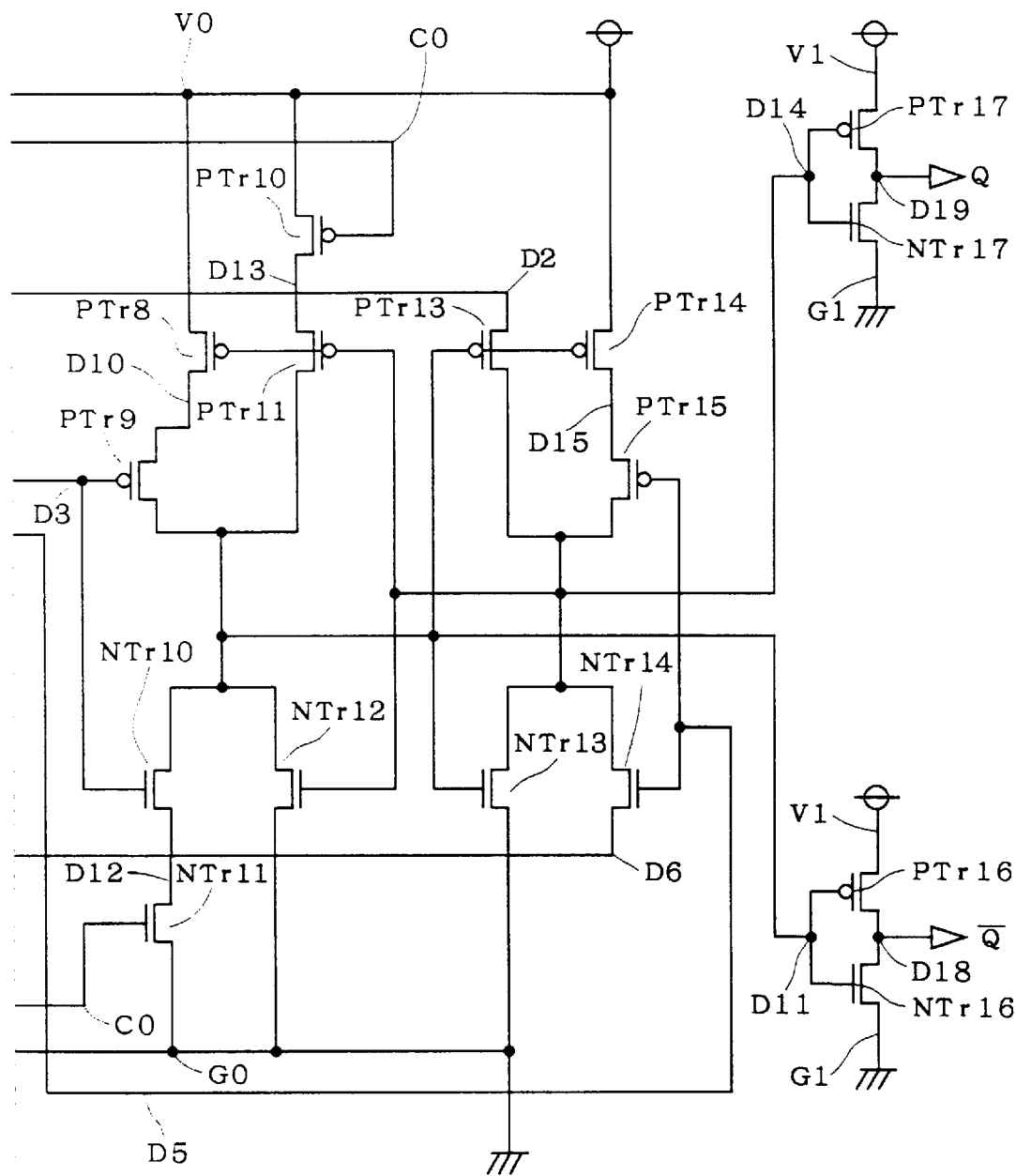
FIG. 5B is a view showing other part of the fifth example of the FF which is used in the semiconductor integrated circuit according to the first preferred embodiment of the present invention.

FIGS. 5A and 5B are views showing another example of the structure of the FF which is used in the semiconductor integrated circuit according to the first preferred embodiment of the present invention, as it is cut along a line A–A'. FIG. 5 is a general view showing the respective positions of FIGS. 5A and 5B. FIG. 5A shows a master side of the FF, while FIG. 5B shows a slave side of the FF. In FIGS. 5A and 5B, the symbols PTrX, NTrX, DX, and *Q denote corresponding elements in FIGS. 11A and 11B. FIGS. 5A and 5B are contiguous to each other at the line A–A'. In FIGS. 5A and 5B, nodes V0, C0, D2, D3, D5, D6 and G0 are electrically connected to each other. The nodes V0 and V1 are electrically connected to power sources. The node C0 receives a clock signal. The nodes G0 and G1 are each grounded. The node D0 receives data.

Now, the structure will be described. The structure of the FF shown in FIGS. 5A and 5B is principally similar to the structure of the FF shown in FIGS. 11A and 11B. As described below, the structure of the FF shown in FIGS. 5A and 5B is equal to the structure shown in FIGS. 11A and 11B as it is modified to replace a plurality of transistors with one transistor. In other words, in the FF shown in FIGS. 11A and 11B, gate electrodes of PTr2, PTr6 and PTr12 which have the same polarity receive the clock signal, and one side current electrodes of PTr2, PTr6 and PTr12 are connected to the node V0 of the power source. Another side current electrode of PTr2 is connected to the node D2, another side current electrode of PTr6 is connected to the node D7, while another side current electrode of PTr12 is connected to the node D16. Such a structure which consists of PTr2, PTr6 and PTr12 is replaced with PTr2 whose gate electrode receives the clock signal, whose one side current electrode is connected to the node V0 of the power source, and whose other side current electrode is connected to the nodes D2, D7 and D16.

In the FF shown in FIGS. 11A and 11B, gate electrodes of NTr5, NTr7 and NTr15 which have the same polarity receive the clock signal, and one side current electrodes of NTr5, NTr7 and NTr15 are connected to the node G0 of the ground. Another side current electrode of NTr5 is connected to the node D6, another side current electrode of NTr7 is connected to the node D8, while another side current electrode of NTr15 is connected to the node D17. Such a structure which consists of NTr5, NTr7 and NTr15 is replaced with NTr5 whose gate electrode receives the clock signal, whose one side current electrode is connected to the node G0 of the ground, and whose other side current electrode is connected to the nodes D6, D8 and D17.

As described above, of PTr2, PTr6, PTr10, PTr12, NTr5, NTr7, NTr11 and NTr15, PTr6, PTr12, NTr7 and NTr15 are deleted, reducing the number of the transistors which operate in response to the clock signal to four gates from eight gates as shown in FIGS. 5A and 5B. In a resulting structure as well, an operation at the nodes D2 and D6 which are shown in FIGS. 5A and 5B is similar to an operation at the nodes D2, D7 and D16, the nodes D6, D8 and D17, respectively. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

Figure 6A:
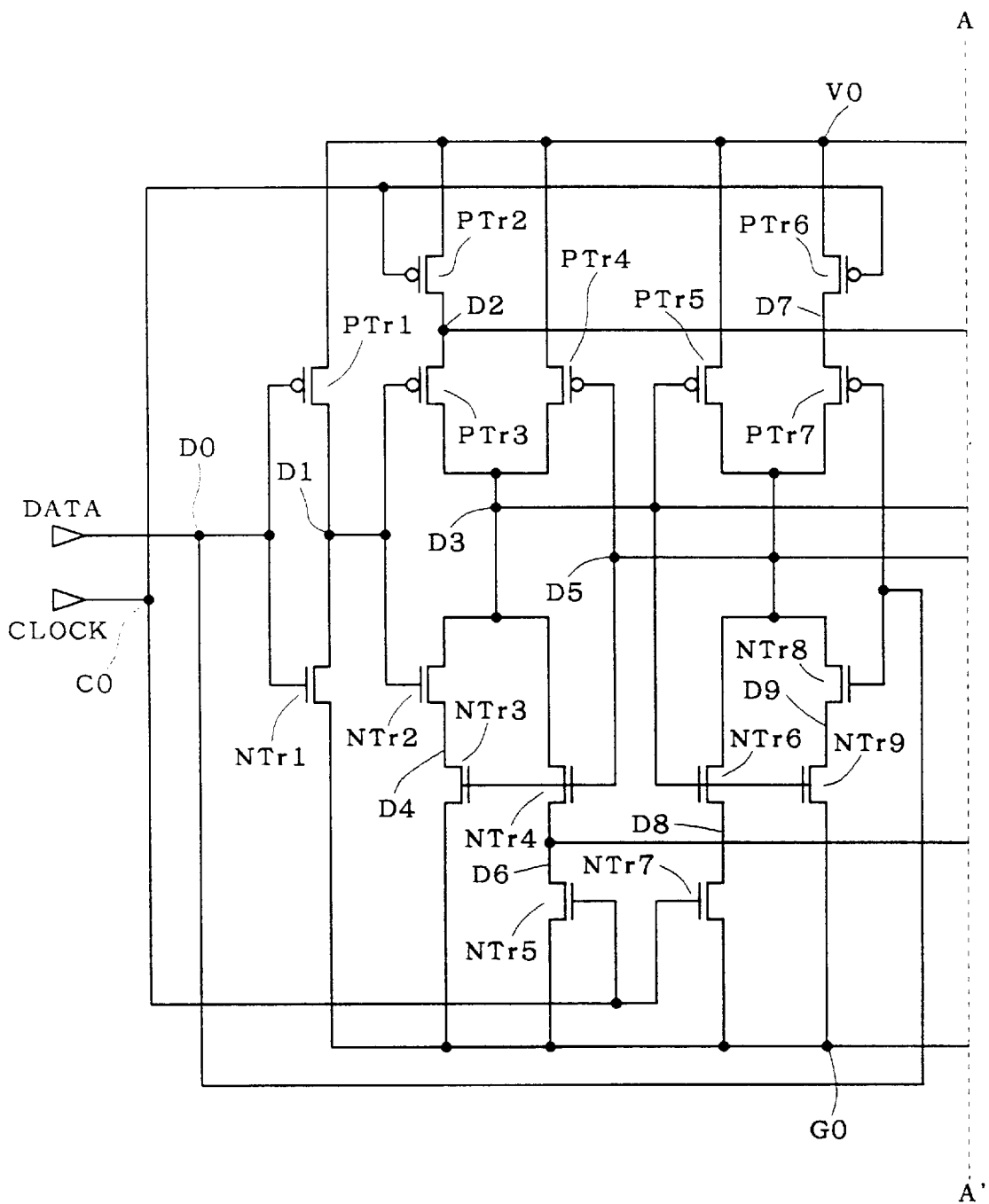
FIG. 6A is a view showing a part of a sixth example of the FF which is used in the semiconductor integrated circuit according to the first preferred embodiment of the present invention.
Figure 6B:
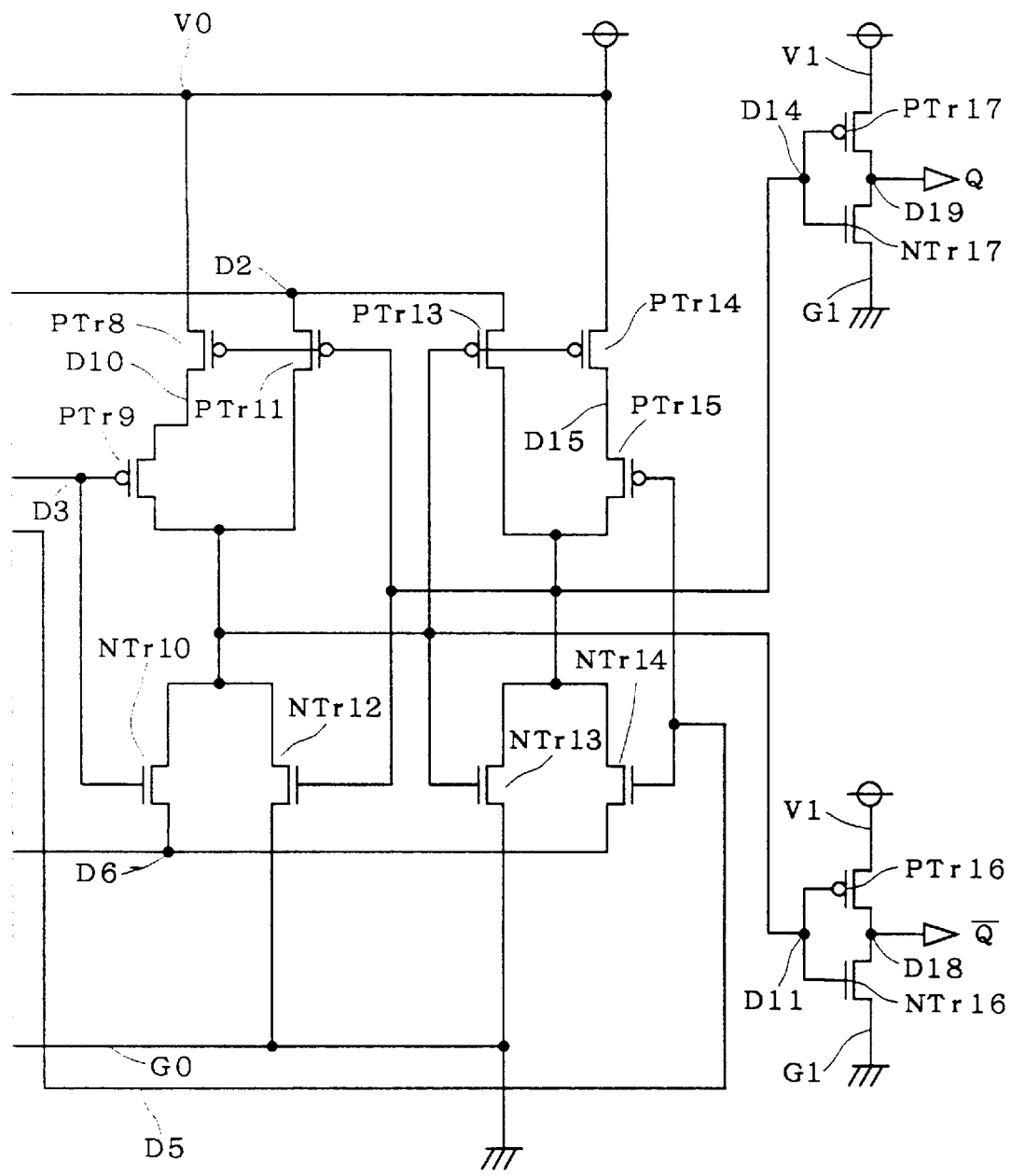
FIG. 6B is a view showing other part of the sixth example of the FF which is used in the semiconductor integrated circuit according to the first preferred embodiment of the present invention.

FIGS. 6A and 6B are views showing another example of the structure of the FF which is used in the semiconductor integrated circuit according to the first preferred embodiment of the present invention, as it is cut along a line A–A'. FIG. 6 is a general view showing the respective positions of 6A and 6B. FIG. 6A shows a master side of the FF, while FIG. 6B shows a slave side of the FF. In FIGS. 6A and 6B, the symbols PTrX, NTrX, DX, and *Q denote corresponding elements in FIGS. 11A and 11B. FIGS. 6A and 6B are contiguous to each other at the line A–A'. In FIGS. 6A and 6B, nodes V0, D2, D3, D5, D6 and G0 are electrically connected to each other. The nodes V0 and V1 are electrically connected to power sources. The node C0 receives a clock signal. The nodes G0 and G1 are each grounded. The node D0 receives data.

Now, the structure will be described. The structure of the FF shown in FIGS. 6A and 6B is principally similar to the structure of the FF shown in FIGS. 11A and 11B. As described below, the structure of the FF shown in FIGS. 6A and 6B is equal to the structure shown in FIGS. 11A and 11B as it is modified to replace a plurality of transistors with one transistor. In other words, in the FF shown in FIGS. 11A and 11B, gate electrodes of PTr2, PTr10 and PTr12 which have the same polarity receive the clock signal, and one side current electrodes of PTr2, PTr10 and PTr12 are connected to the node V0 of the power source. Another side current electrode of PTr2 is connected to the node D2, another side current electrode of PTr10 is connected to the node D13, while another side current electrode of PTr12 is connected to the node D16. Such a structure which consists of PTr2, PTr10 and PTr12 is replaced with PTr2 whose gate electrode receives the clock signal, whose one side current electrode is connected to the node V0 of the power source, and whose other side current electrode is connected to the nodes D2, D13 and D16.

In the FF shown in FIGS. 11A and 11B, gate electrodes of NTr5, NTr11 and NTr15 which have the same polarity receive the clock signal, and one side current electrodes of NTr5, NTr11 and NTr15 are connected to the node G0 of the ground. Another side current electrode of NTr5 is connected to the node D6, another side current electrode of NTr11 is connected to the node D12, while another side current electrode of NTr15 is connected to the node D17. Such a structure which consists of NTr5, NTr11 and NTr15 is replaced with NTr5 whose gate electrode receives the clock signal, whose one side current electrode is connected to the node G0 of the ground, and whose other side current electrode is connected to the nodes D6, D12 and D17.

As described above, of PTr2, PTr6, PTr10, PTr12, NTr5, NTr7, NTr11 and NTr15, PTr10, PTr12, NTr11 and NTr15 are deleted, reducing the number of the transistors which operate in response to the clock signal to four gates from eight gates as shown in FIGS. 6A and 6B. In a resulting structure as well, an operation at the nodes D2 and D6 which are shown in FIGS. 6A and 6B is similar to an operation at the nodes D2, D13 and D16, the nodes D6, D12 and D17, respectively. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

Figure 7:
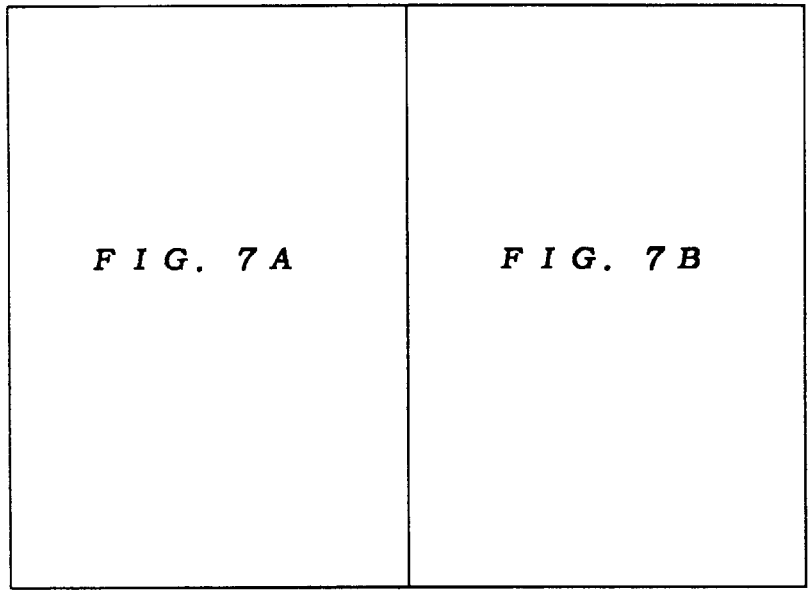
FIG. 7 is a general view showing the respective positions of FIGS. 7A and 7B.
Figure 7A:
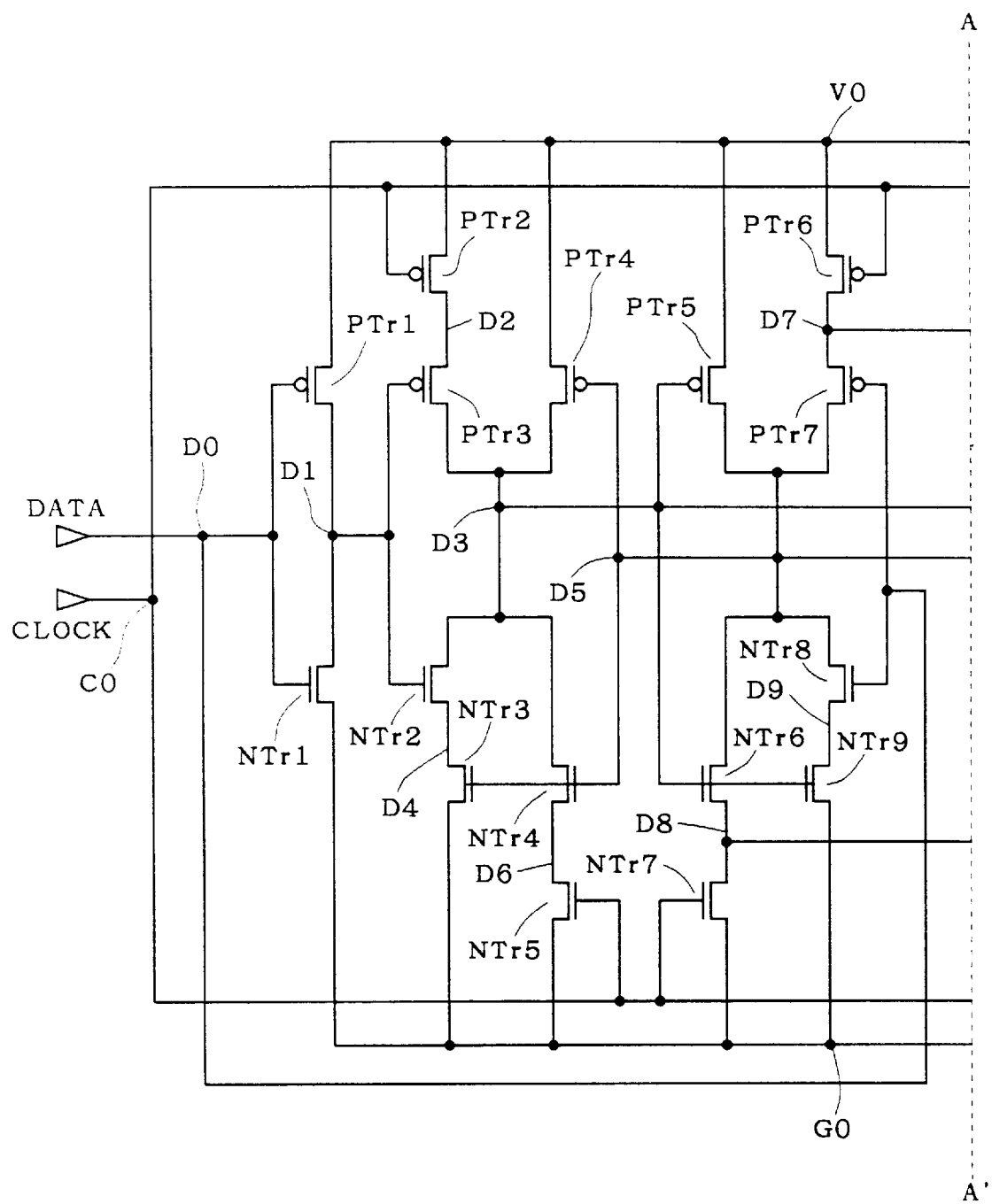
FIG. 7A is a view showing a part of a seventh example of the FF which is used in the semiconductor integrated circuit according to the first preferred embodiment of the present invention.
Figure 7B:
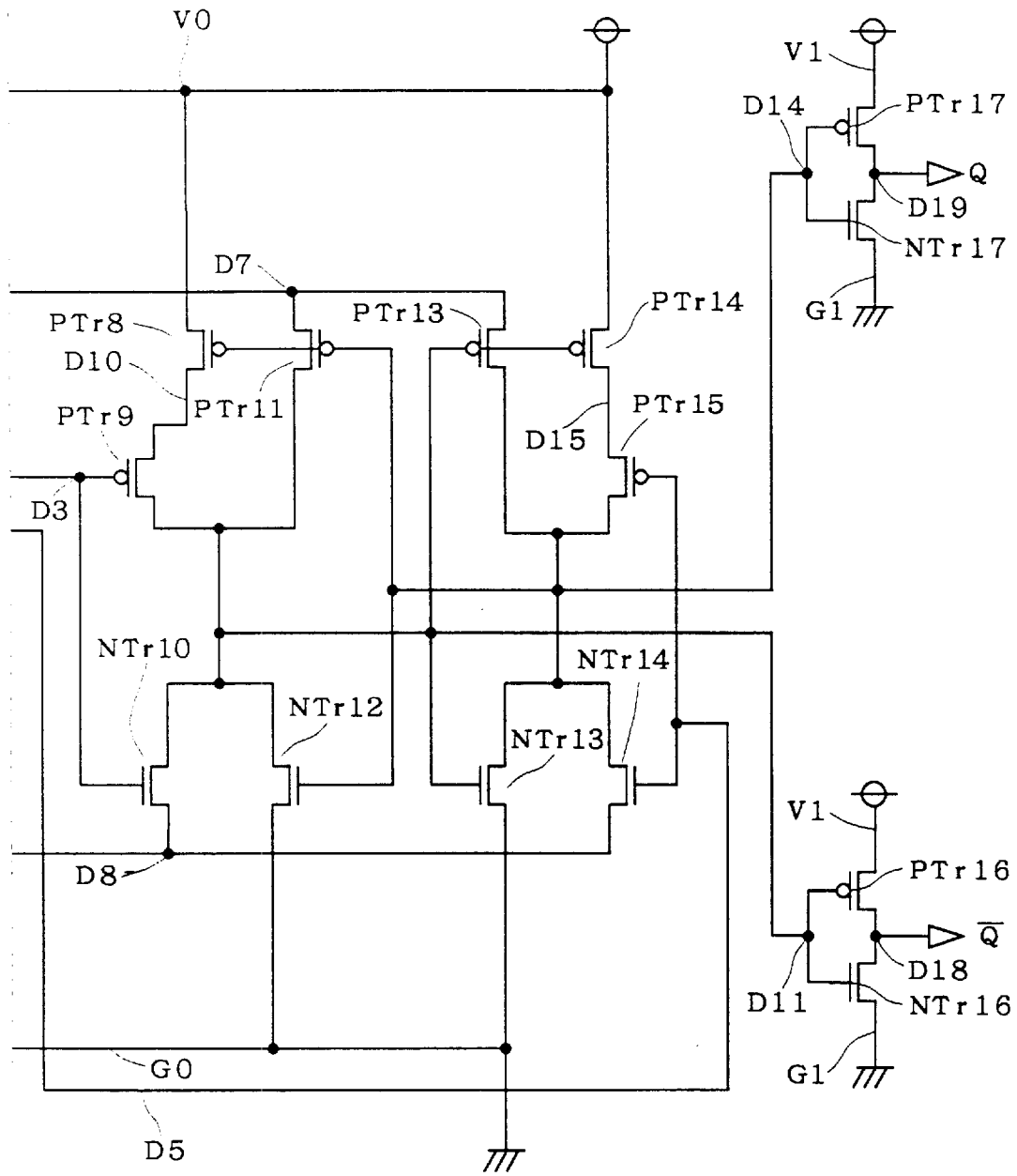
FIG. 7B is a view showing other part of the seventh example of the FF which is used in the semiconductor integrated circuit according to the first preferred embodiment of the present invention.

FIGS. 7A and 7B are views showing another example of the structure of the FF which is used in the semiconductor integrated circuit according to the first preferred embodiment of the present invention, as it is cut along a line A–A'. FIG. 7 is a general view showing the respective positions of FIGS. 7A and 7B. FIG. 7A shows a master side of the FF, while FIG. 7B shows a slave side of the FF. In FIGS. 7A and 7B, the symbols PTrX, NTrX, DX, and *Q denote corresponding elements in FIGS. 11A and 11B. FIGS. 7A and 7B are contiguous to each other at the line A–A'. In FIGS. 7A and 7B, nodes V0, D7, D3, D5, D8 and G0 are electrically connected to each other. The nodes V0 and V1 are electrically connected to power sources. The node C0 receives a clock signal. The nodes G0 and G1 are each grounded. The node D0 receives data.

Now, the structure will be described. The structure of the FF shown in FIGS. 7A and 7B is principally similar to the structure of the FF shown in FIGS. 11A and 11B. As described below, the structure of the FF shown in FIGS. 7A and 7B is equal to the structure shown in FIGS. 11A and 11B as it is modified to replace a plurality of transistors with one transistor. In other words, in the FF shown in FIGS. 11A and 11B, gate electrodes of PTr6, PTr10 and PTr12 which have the same polarity receive the clock signal, and one side current electrodes of PTr6, PTr10 and PTr12 are connected to the node V0 of the power source. Another side current electrode of PTr6 is connected to the node D7, another side current electrode of PTr10 is connected to the node D13, while another side current electrode of PTr12 is connected to the node D16. Such a structure which consists of PTr6, PTr10 and PTr12 is replaced with PTr6 whose gate electrode receives the clock signal, whose one side current electrode is connected to the node V0 of the power source, and whose other side current electrode is connected to the nodes D7, D13 and D16.

In the FF shown in FIGS. 11A and 11B, gate electrodes of NTr7, NTr11 and NTr15 which have the same polarity receive the clock signal, and one side current electrodes of NTr7, NTr11 and NTr15 are connected to the node G0 of the ground. Another side current electrode of NTr7 is connected to the node D8, another side current electrode of NTr11 is connected to the node D12, while another side current electrode of NTr15 is connected to the node D17. Such a structure which consists of NTr7, NTr11 and NTr1S is replaced with NTr7 whose gate electrode receives the clock signal, whose one side current electrode is connected to the node G0 of the ground, and whose other side current electrode is connected to the nodes D8, D12 and D17.

As described above, of PTr2, PTr6, PTr10, PTr12, NTr5, NTr7, NTr11 and NTr15, PTr10, PTr12, NTr11 and NTr15 are deleted, reducing the number of the transistors which operate in response to the clock signal to four gates from eight gates as shown in FIGS. 7A and 7B. In a resulting structure as well, an operation at the nodes D7 and D8 which are shown in FIGS. 7A and 7B is similar to an operation at the nodes D7, D13 and D16, the nodes D8, D12 and D17, respectively. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

Figure 8:
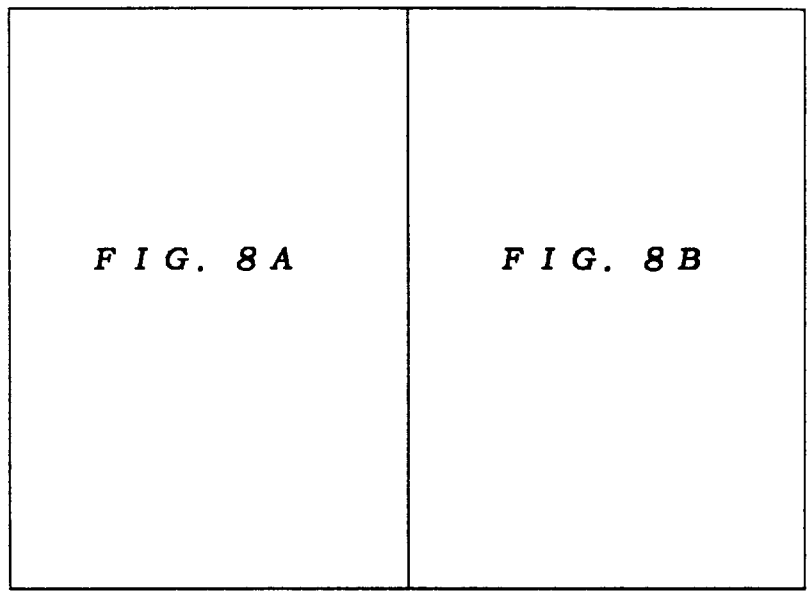
FIG. 8 is a general view showing the respective positions of FIGS. 8A and 8B.
Figure 8A:
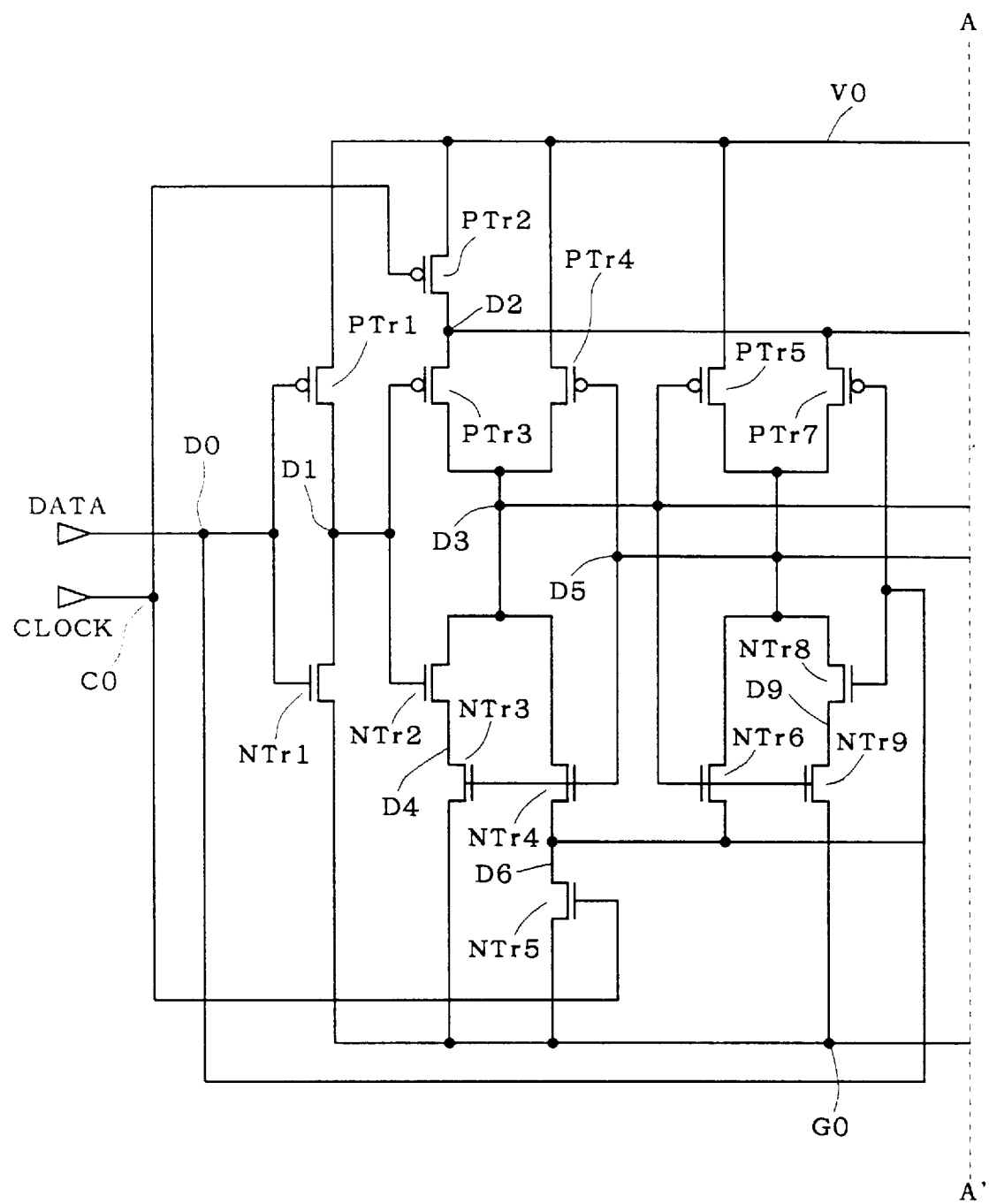
FIG. 8A is a view showing a part of a eighth example of the FF which is used in the semiconductor integrated circuit according to the first preferred embodiment of the present invention.
Figure 8B:
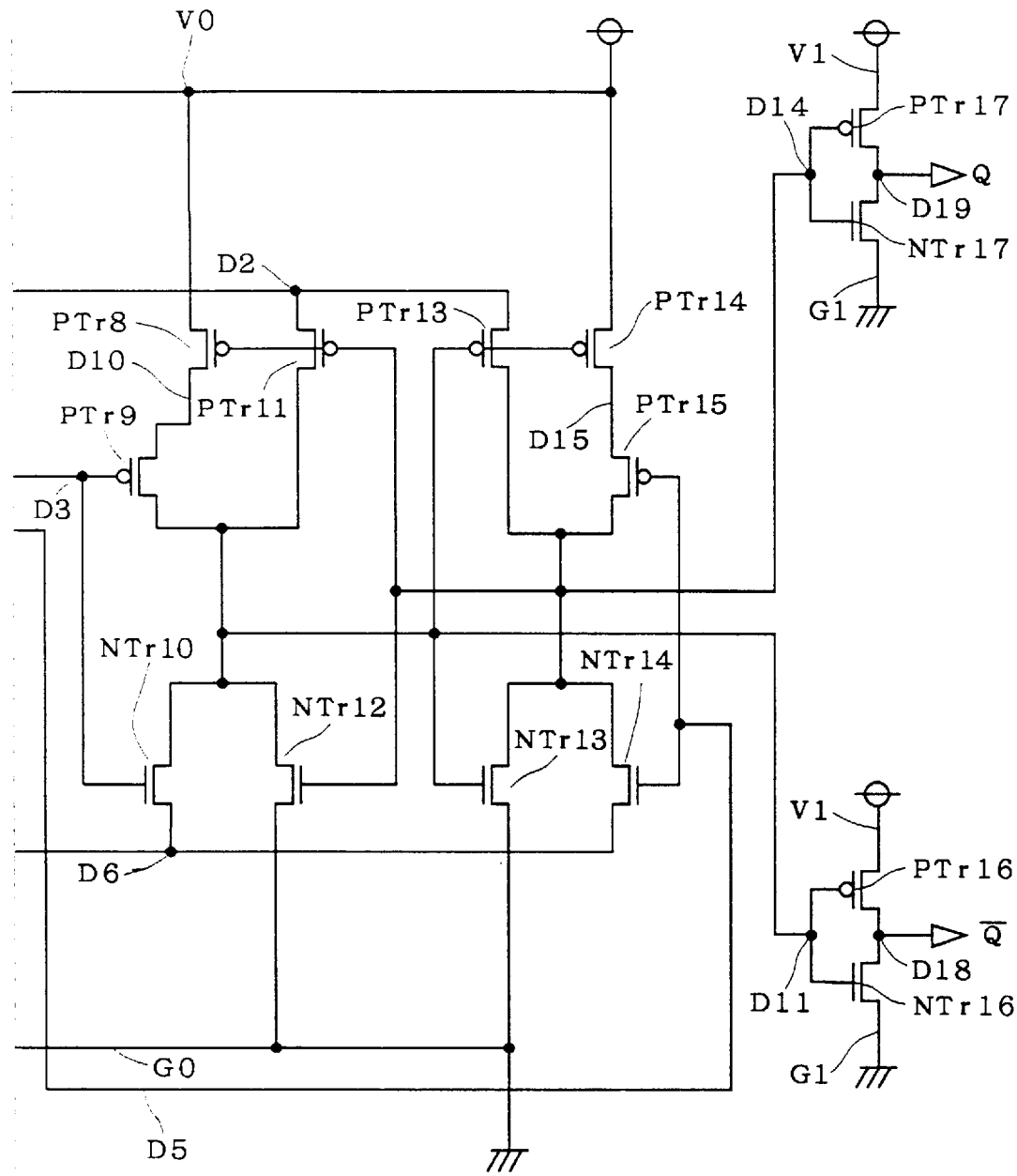
FIG. 8B is a view showing other part of the eighth example of the FF which is used in the semiconductor integrated circuit according to the first preferred embodiment of the present invention.

FIGS. 8A and 8B are views showing another example of the structure of the FF which is used in the semiconductor integrated circuit according to the first preferred embodiment of the present invention, as it is cut along a line A–A'. FIG. 8 is a general view showing the respective positions of FIGS. 8A and 8B. FIG. 8A shows a master side of the FF, while FIG. 8B shows a slave side of the FF. In FIGS. 8A and 8B, the symbols PTrX, NTrX, DX, and *Q denote corresponding elements in FIGS. 11A and 11B. FIGS. 8A and 8B are contiguous to each other at the line A–A'. In FIGS. 8A and 8B, nodes V0, D2, D3, D5, D6 and G0 are electrically connected to each other. The nodes V0 and V1 are electrically connected to power sources. The node C0 receives a clock signal. The nodes G0 and G1 are each grounded. The node D0 receives data.

Now, the structure will be described. The structure of the FF shown in FIGS. 8A and 8B is principally similar to the structure of the FF shown in FIGS. 11A and 11B. As described below, the structure of the FF shown in FIGS. 8A and 8B is equal to the structure shown in FIGS. 11A and 11B as it is modified to replace a plurality of transistors with one transistor. In other words, in the FF shown in FIGS. 11A and 11B, gate electrodes of PTr2, PTr6, PTr10 and PTr12 which have the same polarity receive the clock signal, and one side current electrodes of PTr2, PTr6, PTr10 and PTr12 are connected to the node V0 of the power source. Another side current electrode of PTr2 is connected to the node D2, another side current electrode of PTr6 is connected to the node D7, another side current electrode of PTr10 is connected to the node D13, while another side current electrode of PTr12 is connected to the node D16. Such a structure which consists of PTr2, PTr6, PTr10 and PTr12 is replaced with PTr2 whose gate electrode receives the clock signal, whose one side current electrode is connected to the node V0 of the power source, and whose other side current electrode is connected to the nodes D2, D7, D13 and D16.

In the FF shown in FIGS. 11A and 11B, gate electrodes of NTr5, NTr7, NTr11 and NTr15 which have the same polarity receive the clock signal, and one side current electrodes of NTr5, NTr7, NTr11 and NTr15 are connected to the node G0 of the ground. Another side current electrode of NTr5 is connected to the node D6, another side current electrode of NTr7 is connected to the node D8, an other side current electrode of NTr11 is connected to the node D12, while another side current electrode of NTr15 is connected to the node D17. Such a structure which consists of NTr5, NTr7, NTr11 and NTr15 is replaced with NTr5 whose gate electrode receives the clock signal, whose one side current electrode is connected to the node G0 of the ground, and whose other side current electrode is connected to the nodes D6, D8, D12 and D17.

As described above, of PTr2, PTr6, PTr10, PTr12, NTr5, NTr7, NTr11 and NTr15, PTr6, PTr10, PTr12, NTr7, NTr11 and NTr15 are deleted, reducing the number of the transistors which operate in response to the clock signal to two gates from eight gates as shown in FIGS. 8A and 8B. In a resulting structure as well, an operation at the nodes D2 and D6 which are shown in FIGS. 8A and 8B is similar to an operation at the nodes D2, D7, D13 and D16, the nodes D6, D8, D12 and D17, respectively. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

While FIGS. 1A and 1B show an example where the four structures which are shown in FIGS. 11A and 11B, i.e., the structure consisting of PTr2 and PTr6, the structure consisting of PTr10 and PTr12, the structure consisting of NTr5 and NTr7, and the structure consisting of NTr11 and NTr15, are each replaced with one transistor, at least one of the four structures which are shown in FIGS. 11A and 11B may be replaced with one transistor (This will be referred to as "combination 1".).

Further, while FIGS. 2A and 2B show an example where the four structures which are shown in FIGS. 11A and 11B, i.e., the structure consisting of PTr2 and PTr10, the structure consisting of PTr6 and PTr12, the structure consisting of NTr5 and NTr11, and the structure consisting of NTr7 and NTr15, are each replaced with one transistor, at least one of the four structures which are shown in FIGS. 11A and 11B may be replaced with one transistor (This will be referred to as "combination 2".).

Still further, while FIGS. 3A and 3B show an example where the four structures which are shown in FIGS. 11A and 11B, i.e., the structure consisting of PTr2 and PTr12, the structure consisting of PTr6 and PTr10, the structure consisting of NTr5 and NTr15, and the structure consisting of NTr7 and NTr11, are each replaced with one transistor, at least one of the four structures which are shown in FIGS. 11A and 11B may be replaced with one transistor (This will be referred to as "combination 3".).

Even further, while FIGS. 4A and 4B show an example where the two structures which are shown in FIGS. 11A and 11B, i.e., the structure consisting of PTr2, PTr6 and PTr10 and the structure consisting of NTr5, NTr7 and NTr11, are each replaced with one transistor, at least one of the two structures which are shown in FIGS. 11A and 11B may be replaced with one transistor (This will be referred to as "combination 4".).

Further, while FIGS. 5A and 5B show an example where the two structures which are shown in FIGS. 11A and 11B, i.e., the structure consisting of PTr2, PTr6 and PTr12 and the structure consisting of NTr5, NTr7 and NTr15, are each replaced with one transistor, at least one of the two structures which are shown in FIGS. 11A and 11B may be replaced with one transistor (This will be referred to as "combination 5".).

Still further, while FIGS. 6A and 6B show an example where the two structures which are shown in FIGS. 11A and 11B, i.e., the structure consisting of PTr2, PTr10 and PTr12 and the structure consisting of NTr5, NTr11 and NTr15, are each replaced with one transistor, at least one of the two structures which are shown in FIGS. 11A and 11B may be replaced with one transistor (This will be referred to as "combination 6".).

Even further, while FIGS. 7A and 7B show an example where the two structures which are shown in FIGS. 11A and 11B, i.e., the structure consisting of PTr6, PTr10 and PTr12 and the structure consisting of NTr7, NTr11 and NTr15, are each replaced with one transistor, at least one of the two structures which are shown in FIGS. 11A and 11B may be replaced with one transistor (This will be referred to as "combination 7".).

Further, while FIGS. 8A and 8B show an example where the two structures which are shown in FIGS. 11A and 11B, i.e., the structure consisting of PTr2, PTr6, PTr10 and PTr12 and the structure consisting of NTr5, NTr7, NTr11 and NTr15, are each replaced with one transistor, at least one of the two structures which are shown in FIGS. 11A and 11B may be replaced with one transistor (This will be referred to as "combination 8".).

In addition, the combinations 1 to 8 may be combined with each other. More specifically, any one of the combinations 1 to 8 may be applied to any one of PTr2, PTr6, PTr10 and PTr12 while applying any one of the combinations 1 to 8 to any one of NTr5, NTr7, NTr11 and NTr15. For instance, one possible example in which the combination 1 is applied to any one of PTr2, PTr6, PTr10 and PTr12 while the combination 8 is applied to any one of NTr5, NTr7, NTr11 and NTr15 may be case where the structure consisting of PTr2 and PTr6 shown in FIGS. 11A and 11B is replaced with one transistor and the structure consisting of NTr5, NTr7, NTr11 and NTr15 shown in FIGS. 11A and 11B is replaced with one transistor.

Meanwhile, when a circuit structure consisting of a plurality of transistors is replaced with one transistor, subsequent-stage transistors whose control electrodes receive signals which are developed at current electrodes of the plurality of transistors sometimes fail to normally operate, leading to an abnormal operation of the FF. As herein termed, "normal operation" of a transistor is the same as described earlier in Description of the Prior Art.

A specific example in which the circuit structure consisting of PTr2, PTr6, PTr10 and PTr12 shown in FIGS. 11A and 11B is replaced with one transistor will be considered. Subsequent transistors whose control electrodes receive a signal at a current electrode of PTr2 are PTr5, PTr9, NTr6, NTr9 and NTr10. Subsequent transistors whose control electrodes receive a signal at a current electrode of PTr6 are PTr4, PTr15, NTr3, NTr4 and NTr14. Subsequent transistors whose control electrodes receive a signal at a current electrode of PTr10 are PTr13, PTr14, PTr16, NTr13 and NTr16. Subsequent transistors whose control electrodes receive a signal at a current electrode of PTr12 are PTr8, PTr11, PTr17, NTr12 and NTr17. Hence, when the circuit structure consisting of PTr2, PTr6, PTr10 and PTr12 is replaced with one transistor, a signal at a current electrode of the one replacing transistor must turn on and off a number of these transistors listed immediately above. Depending on the performance of each transistor which forms the FF, therefore, of a number of the transistors listed immediately above, some transistors fail to normally operate. As a result, the FF fails to normally operate.

Hence, by replacing a plurality of transistors with one transistor to such an extent which prohibits any one of the transistors from failing to normally operate, that is, to such an extent which ensures normal operations of subsequent-stage transistors, the FF normally operates.

Second Preferred Embodiment

Figure 9:
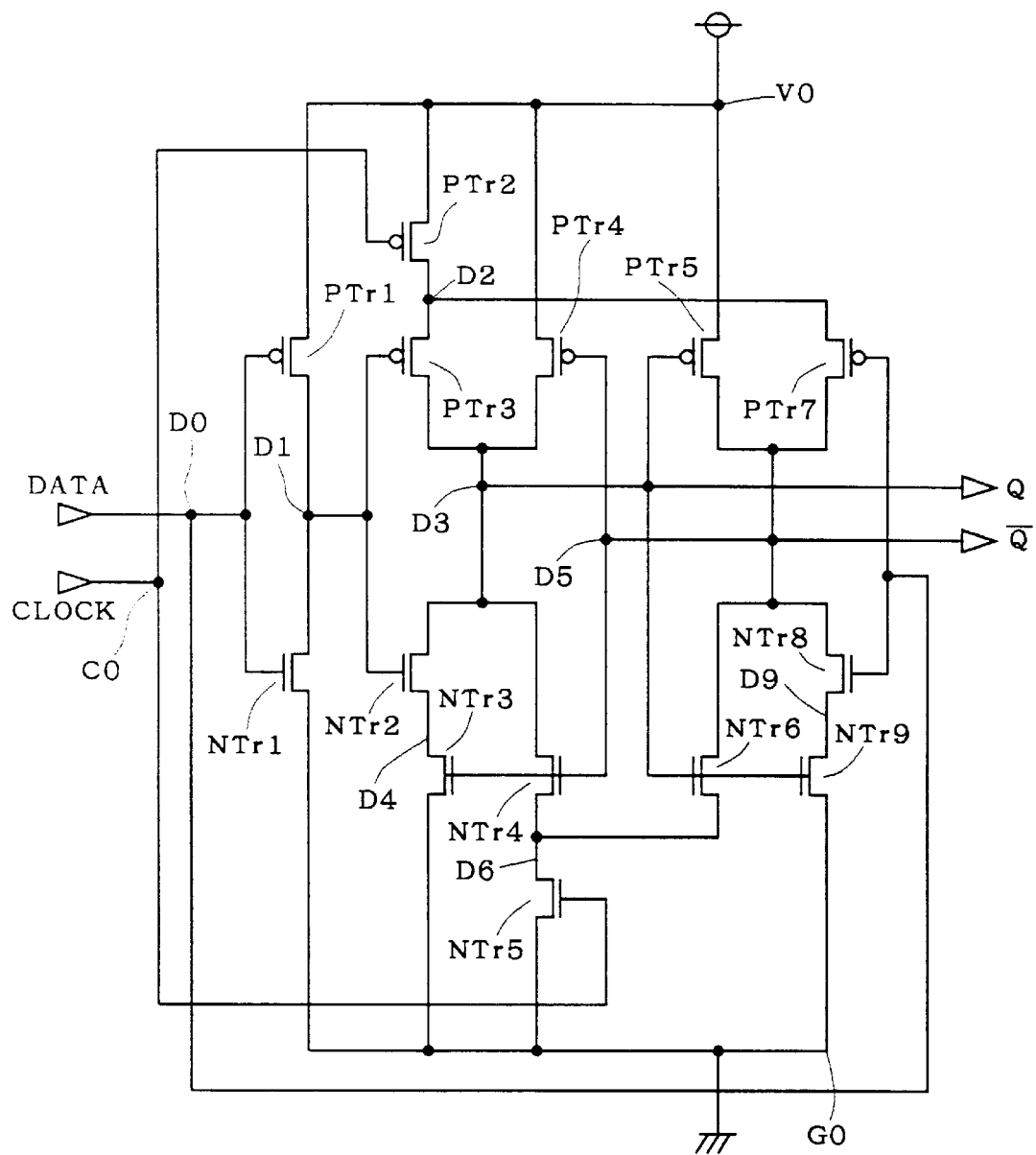
FIG. 9 is a view showing an example of a structure of a latch circuit which is used in a semiconductor integrated circuit according to a second preferred embodiment of the present invention.
Figure 12:
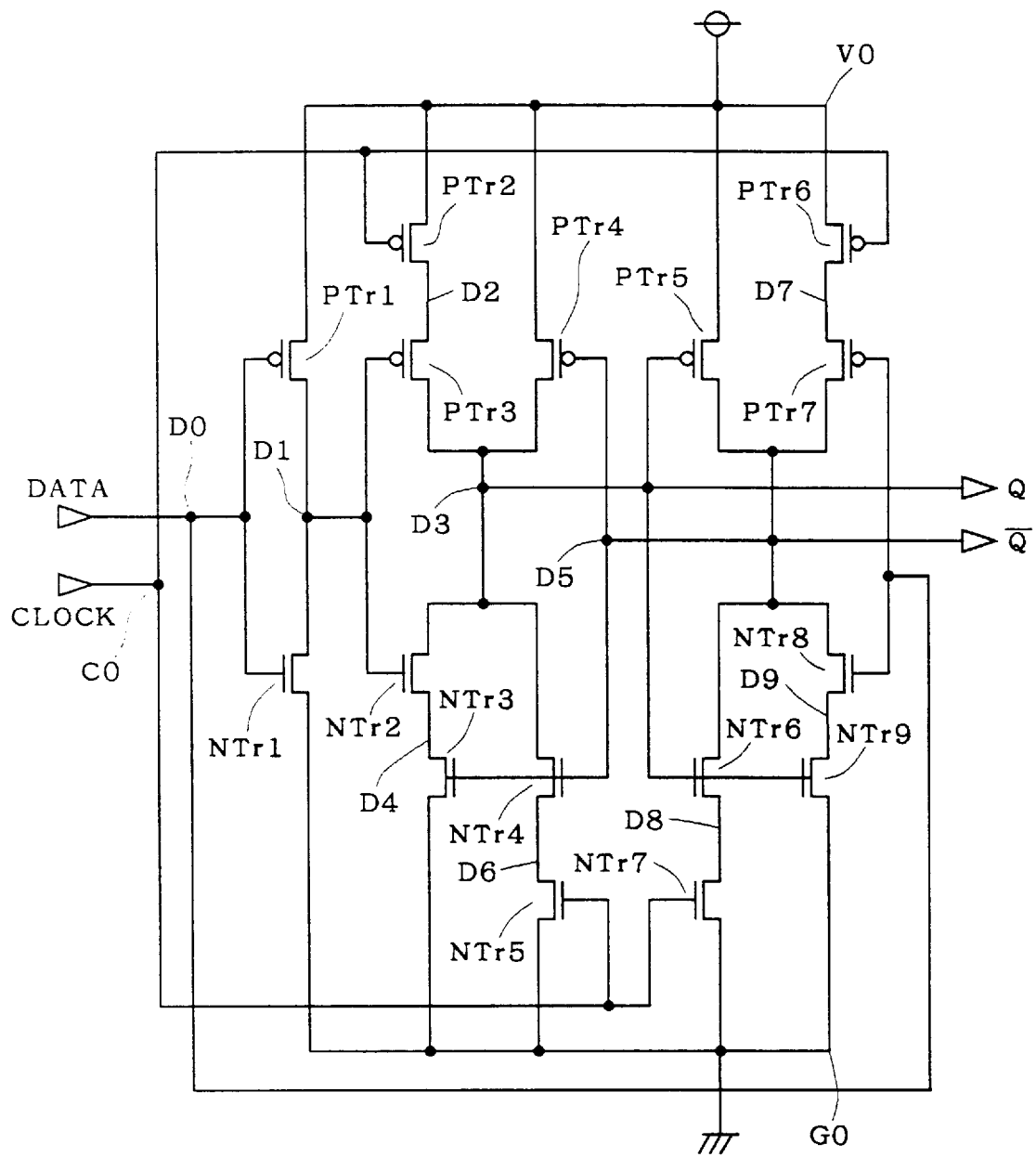
FIG. 12 is a view showing an example of a structure of a latch circuit which is used in a conventional semiconductor integrated circuit.

The present invention is applicable not only to an FF but to a latch circuit as well. FIG. 12 is a view showing an example of a structure of a latch circuit which is used in a conventional semiconductor integrated circuit. In FIG. 12, the symbols PTrX, NTrX, DX, and *Q denote corresponding elements in FIGS. 11A and 11B. The node V0 is connected to a power source. The node C0 receives a clock signal. The node G0 is grounded. The node D0 receives data. FIG. 9 is a view showing an example of a structure of a latch circuit which is used in a semiconductor integrated circuit according to a second preferred embodiment of the present invention. In FIG. 9, the symbols PTrX, NTrX, DX, and *Q denote corresponding elements in FIG. 12. The node V0 is connected to a power source. The node C0 receives a clock signal. The node G0 is grounded. The node D0 receives data.

Now, the structure will be described. The structure of the latch circuit shown in FIG. 9 is principally similar to the structure of the latch circuit shown in FIG. 12. As described below, the structure of the latch circuit shown in FIG. 9 is equal to the structure shown in FIG. 12 as it is modified to replace a plurality of transistors with one transistor. In other words, in the latch circuit shown in FIG. 12, gate electrodes of PTr2 and PTr6 which have the same polarity receive the clock signal, and one side current electrodes of PTr2 and PTr6 are connected to the node V0 of the power source. Another side current electrode of PTr2 is connected to the node D2, while another side current electrode of PTr6 is connected to the node D7. Such a structure which consists of PTr2 and PTr6 is replaced with PTr2 whose gate electrode receives the clock signal, whose one side current electrode is connected to the node V0 of the power source, and whose other side current electrode is connected to the nodes D2 and D7.

In the latch circuit shown in FIG. 12, gate electrodes of NTr5 and NTr7 which have the same polarity receive the clock signal, and one side current electrodes of NTr5 and NTr7 are connected to the node G0 of the ground. Another side current electrode of NTr5 is connected to the node D6, while another side current electrode of NTr7 is connected to the node D8. Such a structure which consists of NTr5 and NTr7 is replaced with NTr5 whose gate electrode receives the clock signal, whose one side current electrode is connected to the node G0 of the ground, and whose other side current electrode is connected to the nodes D6 and D8.

As described above, of PTr2, PTr6, NTr5 and NTr7, PTr6 and NTr7 are deleted, reducing the number of the transistors which operate in response to the clock signal to two gates from four gates as shown in FIG. 9. In a resulting structure as well, an operation at the nodes D2 and D6 which are shown in FIG. 9 is similar to an operation at the nodes D2 and D7, and the nodes D6 and D8, respectively, which are shown in FIG. 12. That is, the function of temporarily maintaining a condition is ensured.

As described above, the capacity of the transistors which are to be driven by the clock signal is reduced by reducing the number of the transistors which operate in response to the clock signal. As a result, power consumption is reduced.

While FIG. 9 shows an example where the two structures which are shown in FIG. 12, i.e., the structure consisting of PTr2 and PTr6 and the structure consisting of NTr5 and NTr7, are each replaced with one transistor, at least one of the two structures which are shown in FIG. 12 may be replaced with one transistor.

Third Preferred Embodiment

Figure 10:
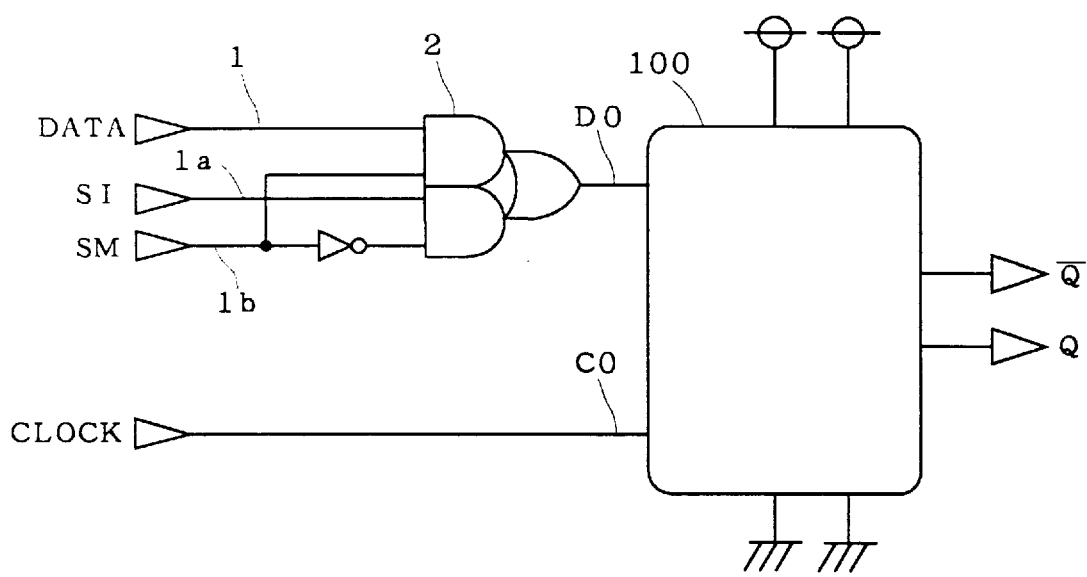
FIG. 10 is a view showing application of a test circuit to an FF or a latch circuit according to a third preferred embodiment of the present invention.

FIG. 10 is a view showing application of a test circuit to an FF or a latch circuit which is included in a semiconductor integrated circuit according to a third preferred embodiment of the present invention. In FIG. 10, denoted at 100 is the FF or the latch circuit which is included in the semiconductor integrated circuit according to the first or the second preferred embodiment, and denoted at 2 is a test circuit which is included in a semiconductor integrated circuit.

A mass production test is conducted before shipping completed semiconductor integrated circuits or at other timing, to test operations of the semiconductor integrated circuits. A "H" level signal SM is supplied to the node 1b during a regular use of a semiconductor integrated circuit, and data which are a signal supplied to the node 1 for a regular use are supplied to the node D0 through a test circuit 2. On the other hand, in a mass production test, an "L" level signal SM is supplied to the node 1b and a test signal SI supplied to the node 1a is supplied to the node D0 through the test circuit 2. The test circuit 2 shown in FIG. 10 is just an example, and may be any circuit of a structure which allows to select a test signal or a signal for a regular use and to output a selected signal to the FF or latch circuit 100.

In this manner, during a test, such as a mass production test, for testing semiconductor integrated circuits, consumption power is reduced and hence a cost associated with the test is accordingly reduced.

While the invention has been described in detail, the foregoing description is in all aspects illustrative and not restrictive. It is understood that numerous other modifications and variations can be devised without departing from the scope of the invention.

We claim:

1. A semiconductor integrated memory circuit for storing data in synchronization with a clock signal comprising:

a plurality of first transistors of a same polarity, each of said plurality of first transistors having a control electrode which receives a H/L signal in accordance with data to be stored, a first current electrode connected to a same first node and a second current electrode connected to different nodes, through which said H/L signal is transferred, said control electrode and second current electrode of each of said plurality of first transistors being connected to respectively, a control electrode and a second current electrode of transistors of a different polarity;

at least one second transistor having a control electrode which receives a clock signal, a first current electrode connected to said same first node, and a second current electrode connected to a power source node, to thereby reduce power consumption by connecting said first current electrodes of said plurality of first transistors together to said power source node through said at least one second transistor.

2. The semiconductor integrated memory circuit of claim 1, wherein said plurality of first transistors and said at least one second transistor are included in a flip-flop circuit including a master side and a slave side.

3. The semiconductor integrated memory circuit of claim 1, further including subsequent-stage transistors having control electrodes which respectively receive said H/L signal at said different nodes.

4. The semiconductor integrated circuit of claim 2, wherein said plurality of first transistors are included in only one of said master side and said slave side of said flip-flop circuit.

5. The semiconductor integrated memory circuit of claim 2, further comprising a test circuit which selects a signal which is used to test said semiconductor integrated memory circuit or a signal which is used in a regular use of said semiconductor integrated circuit, and said test circuit outputs a selected signal to said flip-flop circuit.

6. The semiconductor integrated memory circuit of claim 1, wherein said plurality of first transistors and said at least one second transistor are included in a latch circuit.

7. The semiconductor integrated memory circuit of claim 6, further comprising a test circuit which selects a signal which is used to test said semiconductor integrated memory circuit or a signal which is used in a regular use of said semiconductor integrated circuit, and said test circuit outputs a selected signal to said latch circuit.

* * * * *